(12) United States Patent
Graham

(10) Patent No.: US 11,862,983 B1
(45) Date of Patent: Jan. 2, 2024

(54) EARTH ENERGY SYSTEMS AND DEVICES

(71) Applicant: Roger W. Graham, Santa Barbara, CA (US)

(72) Inventor: Roger W. Graham, Santa Barbara, CA (US)

( * ) Notice: Subject to any disclaimer, the term of this patent is extended or adjusted under 35 U.S.C. 154(b) by 371 days.

(21) Appl. No.: 16/833,583

(22) Filed: Mar. 28, 2020

Related U.S. Application Data

(60) Provisional application No. 62/825,798, filed on Mar. 28, 2019.

(51) Int. Cl.
| | |
|---|---|
| *H02J 50/00* | (2016.01) |
| *H01M 10/42* | (2006.01) |
| *H01L 25/065* | (2023.01) |
| *H01Q 1/24* | (2006.01) |
| *H01L 23/58* | (2006.01) |
| *H01M 50/218* | (2021.01) |
| *H02J 50/40* | (2016.01) |

(52) U.S. Cl.
CPC ............ *H02J 50/001* (2020.01); *H01L 23/58* (2013.01); *H01L 25/0657* (2013.01); *H01M 10/4257* (2013.01); *H01M 50/218* (2021.01); *H01Q 1/248* (2013.01); *H02J 50/40* (2016.02); *H01M 2010/4271* (2013.01)

(58) Field of Classification Search
CPC ......... H02J 50/001; H02J 50/40; H01L 23/58; H01L 25/0657; H01M 10/4257; H01M 50/20; H01M 2010/4271; H01Q 1/248
USPC ....................................................... 320/119
See application file for complete search history.

(56) References Cited

U.S. PATENT DOCUMENTS

| | | |
|---|---|---|
| 155,209 A | 9/1874 | Snow |
| 160,152 A | 2/1875 | Bryan |
| 180,983 A | 8/1876 | Barrett |
| 182,802 A | 10/1876 | Cerpaux |
| 211,322 A | 1/1879 | Drawbaugh |
| 303,560 A | 10/1884 | Cledland |
| 329,724 A | 11/1885 | Dieckmann |
| 393,573 A | 11/1888 | Paget |
| 450,285 A * | 4/1891 | Crowdus ............ H01M 50/543 429/179 |
| 495,582 A | 4/1893 | Emme |
| 504,455 A | 9/1893 | Reed |
| 552,220 A | 12/1895 | Williams |
| 563,428 A | 7/1896 | Still |
| 628,492 A | 7/1899 | Risdale |
| 728,381 A | 5/1903 | Emme |
| 1,649,579 A | 11/1927 | Edison |
| 2,515,204 A | 7/1950 | Evans |
| 2,597,455 A | 5/1952 | Coleman |
| 2,636,916 A | 4/1953 | Licharz |
| 3,288,648 A | 11/1966 | Jones |
| 3,348,105 A | 10/1967 | Doyle |

(Continued)

FOREIGN PATENT DOCUMENTS

| | | | | |
|---|---|---|---|---|
| DE | 102012205810 A1 | * | 10/2013 | .......... H01M 10/625 |
| KR | 20110054997 A | * | 5/2011 | ............. A45D 34/04 |

*Primary Examiner* — M Baye Diao
(74) *Attorney, Agent, or Firm* — Roger W. Graham

(57) ABSTRACT

Systems, devices, and methods, for harvesting, storing, and using electricity from earth energy devices, particularly involving galvanic cells and antenna received energy. FIGS. 1 through 5 depict numerous technical features and embodiments for combination and utilization in said systems, devices, and methods.

20 Claims, 10 Drawing Sheets

(56) References Cited

U.S. PATENT DOCUMENTS

Figure 1J:
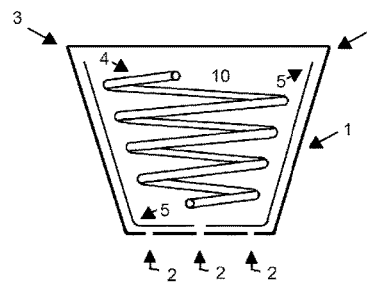

| | | | |
|---|---|---|---|
| 3,839,782 A | 10/1974 | Lincoln | |
| 3,902,485 A | 9/1975 | Wallace | |
| 4,214,120 A | 7/1980 | Jones | |
| 4,360,741 A | 11/1982 | Fitzsimmons | |
| 4,457,988 A | 7/1984 | Ryeczek | |
| 4,878,094 A | 10/1989 | Balkanski | |
| 5,012,323 A | 4/1991 | Farnworth | |
| 5,021,306 A | 6/1991 | Sauer | |
| 5,043,235 A * | 8/1991 | Seefeldt | H01M 50/538 |
| | | | 429/94 |
| 5,608,262 A | 3/1997 | Degani | |
| 5,608,265 A | 3/1997 | Kitano | |
| 5,731,691 A | 3/1998 | Noto | |
| 5,864,182 A | 1/1999 | Matsuzaki | |
| 5,959,535 A | 9/1999 | Remsburg | |
| 6,037,743 A | 3/2000 | White | |
| 6,140,924 A | 10/2000 | Chia | |
| 6,197,450 B1 | 3/2001 | Nathan | |
| 6,208,018 B1 | 3/2001 | Ma | |
| 6,264,709 B1 | 7/2001 | Yoon | |
| 6,287,893 B1 | 9/2001 | Elenius | |
| 6,610,440 B1 | 8/2003 | Lafollette | |
| 6,703,713 B1 | 3/2004 | Tseng | |
| 6,740,541 B2 | 5/2004 | Rajeev | |
| 6,765,363 B2 | 7/2004 | Lafollette | |
| 7,045,372 B2 | 5/2006 | Ballantine | |
| 7,064,442 B1 | 6/2006 | Lane | |
| 7,109,934 B2 | 7/2006 | Devilbiss | |
| 7,084,605 B2 | 8/2006 | Mickle | |
| 7,618,748 B2 | 11/2009 | Nathan | |
| 8,045,947 B2 * | 10/2011 | Mandal | H01Q 1/248 |
| | | | 455/73 |
| 8,115,683 B1 | 2/2012 | Stefanakos | |
| 8,330,298 B2 | 12/2012 | Sherbenski | |
| 8,552,597 B2 | 10/2013 | Song | |
| 8,621,245 B2 | 12/2013 | Shearer | |
| 8,761,842 B2 | 6/2014 | Jacobs | |
| 8,785,034 B2 | 7/2014 | Forster | |
| 9,133,552 B2 * | 9/2015 | McAlister | C25B 13/02 |
| 10,123,833 B2 * | 11/2018 | McPherson | H02J 50/70 |
| 10,263,297 B2 * | 4/2019 | Maxwell | H01M 10/4257 |
| 10,362,115 B2 * | 7/2019 | Bommer | H04W 84/18 |

* cited by examiner

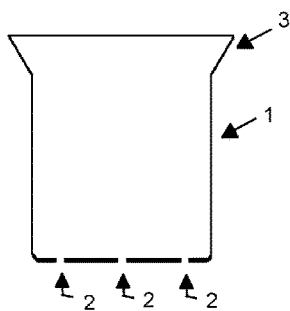
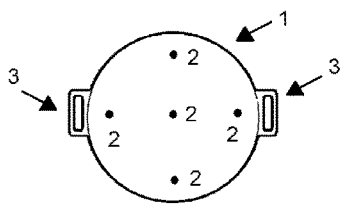
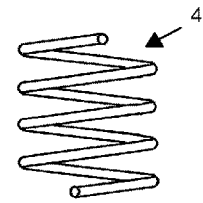
Fig. 1a　　　　　Fig. 1b　　　　　Fig. 1c
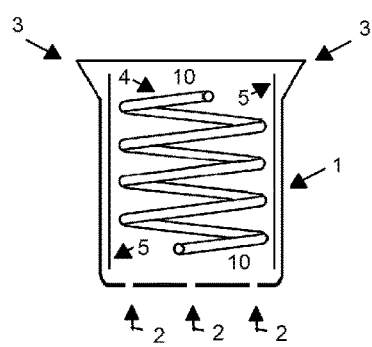
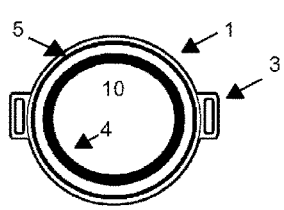
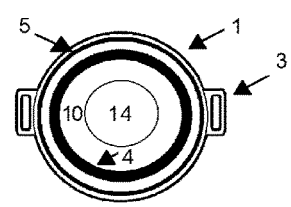
Fig. 1d　　　　　Fig. 1e　　　　　Fig. 1f
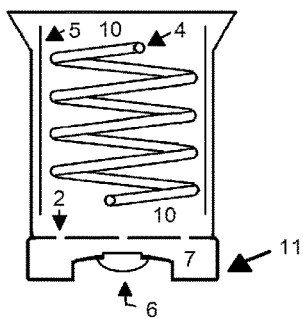
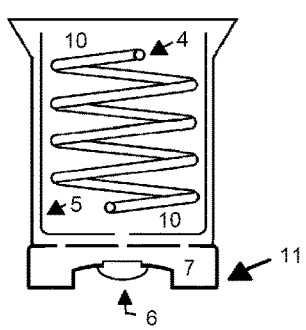
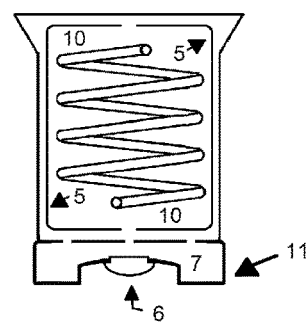
Fig. 1g　　　　　Fig. 1h　　　　　Fig. 1i

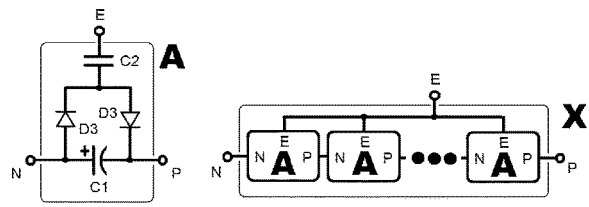
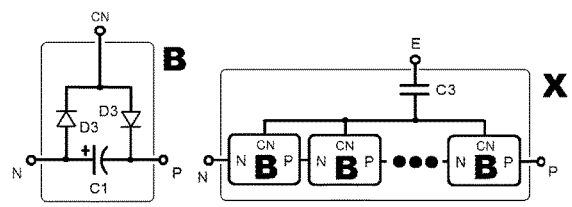
Fig. 4a                                Fig. 4b
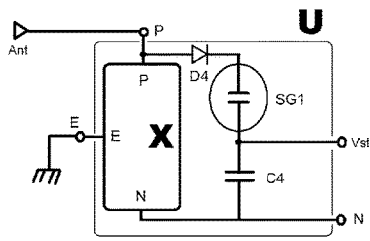
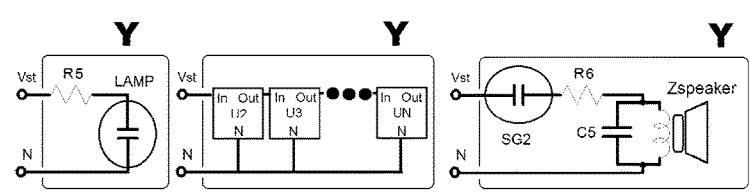
Fig. 4c                                Fig. 4d
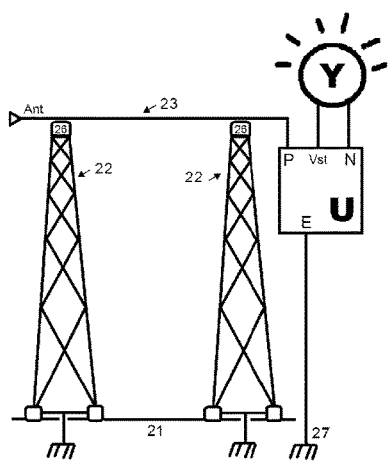
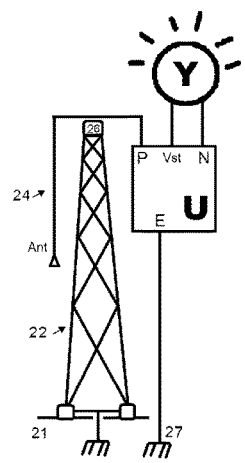
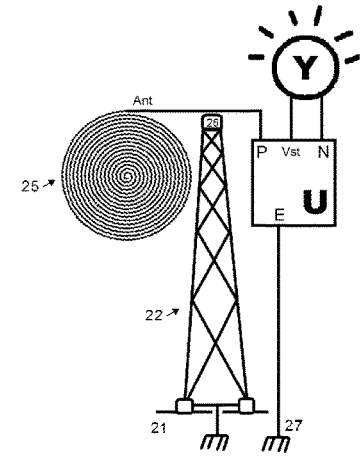
Fig. 4e           Fig. 4f           Fig. 4g

EARTH ENERGY SYSTEMS AND DEVICES

CROSS-REFERENCE TO RELATED APPLICATIONS

The present application claims priority to the earlier filed provisional application 62/825,798 filed Mar. 28, 2019 and hereby incorporates by reference the subject matter of said provisional application in its entirety.

FEDERALLY SPONSORED RESEARCH

Not Applicable

SEQUENCE LISTING OR PROGRAM

Not Applicable

BACKGROUND OF THE INVENTION—FIELD OF THE INVENTION

The present invention relates generally to systems and devices for generating, capturing, storing, transforming, and utilizing harvested electricity. More particularly, the present invention relates to interchangeable components, devices, and systems comprising novel galvanic cells and antenna receiver systems, including transformative circuits utilized therewith. The present invention also comprises useful electrical schematic implementations, block diagram configurations, and interconnection methods for a plurality of systems and uses.

INCORPORATION BY REFERENCE

The present application claims priority to the earlier filed provisional application 62/825,798 filed Mar. 28, 2019 and hereby incorporates by reference the subject matter of said provisional application in its entirety. No new matter has been added.

BACKGROUND OF THE INVENTION—OBJECTS AND ADVANTAGES

Nature has dazzled mankind with its sub-atomic wheel work for millenniums. For example, lightning bolts reveal nature's wheel work. Atmospheric bursts of electricity display the power of bridled electrical charge and voltage potentials in the atmosphere. Mankind has struggled for centuries to harness and manipulate electricity, and to develop affordable, compact, efficient, and renewable means to use it. The present invention relates to novel, affordable, compact, environmentally friendly, renewable, and efficient, systems and devices to harvest and use electricity from galvanic cells and atmospheric antenna systems.

There are many ways to generate electricity, and harvest it, because after all, atoms are comprised of charged sub-atomic particles. For this reason, electrical potentials are everywhere. One such way to produce electricity is to utilize a galvanic cell, whereby two different metals are placed into an electrolyte, such as water-moistened earth soil. A low voltage will develop across the metals as electro-chemical reactions ensue and charges accumulate around the electrodes. The low voltage DC of a galvanic cell may thus be utilized to power circuitry. Accordingly, copper and zinc are two such metals which will develop a useful voltage potential between them, albeit less than 1 volt DC. A second method for harvesting electricity is to utilize antenna receiver systems and rectification circuits. In much the same way that ocean waves flow day and night, so do ambient charged particle waves, ebbing and flowing, propagating through the atmosphere and air constantly.

When copper and zinc masses are placed in water-moistened soil, an electrical potential develops across the two electrodes. This is a galvanic cell. Copper presents a more positive electrical potential than does the zinc. For a galvanic cell of this composition, copper is the positive electrode, and zinc is the negative electrode. The small electrical potential difference (DC voltage) between the two metal electrodes can then be given a preferential circuit path to equilibrate pent-up charge through a connective wire or a circuit load. Electricity will flow between the zinc and copper electrodes by way of the circuit connecting the two electrodes. Useful work can thereby be done in this fashion.

Galvanic cells were utilized many years ago to crudely drive early telegraph transmissions. Telegraph pulses were essentially electrical bursts hand-shunted from a galvanic cell or cells into wires and circuits connecting two remote locations. These short bursts of electrical current could be received and decoded many miles away. But there were a number of shortcomings, and burying these galvanic cells in the earth did not always overcome natural electrical potentials across the earth's surface. Portable, cheap, compact, simple, and powerful galvanic cells were needed. The present invention overcomes many of the shortcomings.

The present invention resolves many long standing issues by presenting multiple embodiments which are compact, affordable, inter-changeable, portable, simple, easily replaceable, and efficient. Notably, the present invention also includes embodiments describing galvanic powered integrated circuits.

As for antenna harvested electricity, the electrical potential of the ambient electrical waves in the air varies, much as ocean waves do, particularly relative to the electrical potential of earth ground. Capturing electrical energy in the air can be tricky due to the inherently low voltage and charge levels. Specialized circuits and rectification systems presented herein have utility in this endeavor. The present invention utilizes a system of circuits and devices to capture and compound atmospheric electricity in simple, affordable, inter-changeable, portable, efficient, and compact embodiments.

Advantages

The present invention has many advantages:
(a) The present invention addresses the inconvenience of galvanic cells and atmospheric antenna receivers by providing simple, compact, inter-changeable, portable, and replaceable embodiments.
(b) Advantageous in significantly reducing the cost and complexity of galvanic cell systems and antenna receiver systems.
(c) Advantageous in being relatively easy to manufacture and set up, especially in the simplest embodiments.
(d) Advantageous in being aesthetically pleasing and compact. Aesthetics and size have a significant utility, necessity, and advantage for many folks wanting to place galvanic cell systems or antenna receiver systems outdoors, in a yard setting, or on a patio.
(e) Advantageous in convenience, thereby having much utility and advantage for those who cannot be bothered with more complex and cumbersome approaches.

SUMMARY

The present invention is directed toward systems and devices for harvesting and utilizing earth energy sources, particularly galvanic cell systems and antenna reception and rectification systems and devices A plurality of embodiments are presented in FIGS. 1, 2, 3, 4, and 5. These embodiments include novel galvanic cell systems, devices, methods, components, and circuits, as well as novel antenna energy capture systems, devices, methods, components, and circuits. Substantive guidance and method steps for utilizing the embodiments are described herein.

These systems, devices, methods, circuits, and various features, aspects, and advantages of the present invention, will become better understood after reviewing the following figures and descriptions.

DRAWINGS—FIGURES

Numerous embodiments of the present invention are disclosed in the following FIGS. 1 through 5:

FIGURE Description

1a Side View: A galvanic cell containment apparatus possessing carry handles and exit flow holes 1b Top View: A galvanic cell containment apparatus possessing carry handles and exit flow holes 1c Side View: A positive electrode, substantially spiral-shaped 1d Side View: A galvanic cell containment apparatus with negative electrode sheeting surrounding a spiral-shaped positive electrode 1e Top View: A galvanic cell containment apparatus with negative electrode sheeting surrounding a spiral-shaped positive electrode 1f Top View: A galvanic cell containment apparatus with negative electrode sheeting surrounding a spiral-shaped positive electrode, and a substantially evacuated cavity in the center of the cell 1g Side View: FIG. 1d also comprising a bottom fluid containment reservoir and plug means 1h Side View: FIG. 1g with negative electrode sheeting extending under the spiral-shaped positive electrode 1i Side View: FIG. 1g with negative electrode sheeting extending both over and under the spiral-shaped positive electrode 1j Side View: FIG. 1d comprising substantially conical-shaped electrode and container features and elements 1k Side View: FIG. 1h comprising conical-shaped features and elements 1l Side View: FIG. 1h comprising conical-shaped features and elements 1m Top View: FIGS. 1k and 1l 1n Side View: FIG. 1k possessing an alternate embodiment simplified bottom containment reservoir 1o Side View: FIG. 1l possessing an alternate embodiment simplified bottom containment reservoir 1p Top View: FIGS. 1n and 1o 2a Top View: Negative electrode depicted as a substantially flat sheet, prior to formation as depicted in FIGS. 2b and 2c 2b Side View: Negative electrode with lower extension traversing underneath the spiral-shaped positive electrode 2c Top View: Negative electrode, after forming 2d Top View: Negative electrode depicted as a substantially flat sheet, prior to formation as shown in FIGS. 2e and 2f 2e Side View: Negative electrode with both lower and upper extensions to substantially surround the spiral-shaped positive electrode 2f Top View: Negative electrode, after forming 2g Side View: Alternate conical-shaped embodiment of negative electrode possessing lower extension traversing under the spiral-shaped positive electrode 2h Top View: Negative electrode of FIG. 2g depicted as a substantially flat sheet, prior to forming 2i Top View: Negative electrode of FIG. 2g, after forming 2j Side View: Alternate conical embodiment of negative electrode possessing both lower and upper extensions substantially enclosing the spiral-shaped positive electrode 2k Top View: Negative electrode of FIG. 2j depicted as a substantially flat sheet, prior to forming 2l Top View: Negative electrode of FIG. 2j, after forming 3a Schematic: A light controlled electricity conversion circuit 3b Schematic: An alternate embodiment of FIG. 3a 3c Side View: A depiction of adjacently positioned air-coupled radial leaded inductors, L1 and L2

3d Schematic: A simple oscillator circuit utilizing 3 coupled inductors

3e Schematic: A switchable load circuit comprising a plurality of parallel diodes 3f Schematic: A switchable load circuit comprising a plurality of series diodes 3g Schematic: A switchable load circuit comprising a diode in series with a speaker 3h Schematic: A switchable load circuit comprising a diode and a resistor in series with a rechargeable battery 3i Schematic: A switchable load circuit comprising a lamp, filled with an excitable gas such as neon 4a Schematic: Wave reception and rectification circuit A, and an arrayed plurality shown as block X 4b Schematic: Alternate wave reception and rectification circuit B, and an arrayed plurality shown as block X 4c Schematic: An arrayed plurality of wave reception rectifiers (X) coupled with an energy storage circuit shown as block U 4d Schematic: Three Load circuit embodiments shown individually as block Y 4e Schematic: Circuit block U coupled to circuit block Y and coupled to a substantially horizontal antenna orientation 4f Schematic: Circuit block U coupled to circuit block Y and coupled to a substantially vertical antenna orientation 4g Schematic: Circuit block U coupled to circuit block Y and coupled to a substantially spiraled antenna orientation either flat-would, helical, or both 5a Top View: Example of a galvanic powered micro-chip 5b Side View: Example of a galvanic powered micro-chip 5c Schematic: An example block diagram for galvanic powered micro-chip circuit blocks and micro-circuits 5d Side View: Example of a plurality of stacked galvanic powered micro-chips 5e Schematic: An example block diagram for a plurality of galvanic powered micro-chip circuit blocks and micro-circuits 5f Side View: Example of a plurality of stacked galvanic powered micro-chips, with addition of a galvanic metal base (50) on one end of the stack 5g Schematic: An example block diagram for a plurality of galvanic powered micro-chip circuit blocks and micro-circuits, wherein the galvanic metal base (50) is utilized as part of the galvanic cell

DRAWINGS—REFERENCE NUMERALS

Ref. Numeral Description
1 Galvanic cell containment apparatus
2 Flow holes

3 Handles
4 Positive electrode
5 Negative electrode
6 Fluid containment reservoir plug
7 Fluid containment reservoir capture
8 Negative electrode lower edges
9 Lower bend region of negative electrode
10 Example electrolyte regions near positive and negative electrodes
11 Fluid containment reservoir
12 Alternate fluid containment reservoir
13 unused
14 Evacuated region near center of positive electrode
15 unused
16 Top edge of negative electrode
17 unused
18 unused
19 Negative electrode upper edges
20 Upper bend region of negative electrode
21 Earth
22 Antenna elevation means
23 Antenna in horizontal orientation
24 Antenna in vertical orientation
25 Antenna in coiled orientation
27 Earth ground location
28 unused
29 unused
30 Micro-chip, micro-circuits
31 Copper layer in micro-chip
32 Bond pad on micro-chip, plurality
33 Bond pad on micro-chip, plurality
34 Bond pad on micro-chip, plurality
35 Encapsulant over bond pad(s), electrically insulating
36 Bond wire, electrical interconnect
37 Copper layer, top surface, galvanic cell metal, Vp
38 Via, plurality, electrical interconnect between micro-chip layers
39 Via, plurality, electrical interconnect between micro-chip layers
40 Silicon dioxide insulation between micro-chip layers
41 Diffusions in substrate or epitaxial layer of semiconductor material
42 Diffusions in substrate or epitaxial layer of semiconductor material
43 Diffusions in substrate or epitaxial layer of semiconductor material
44 Substrate or epitaxial layer of semiconductor material
45 Encapsulant substantially around semiconductor material
46 Transistor gate, one of a plurality of transistors
47 Substrate or epitaxial layer of semiconductor material
48 Surface of contact between first and second micro-chips, stacked
49 Encapsulant substantially around stacked micro-chip assembly
50 Metallic sheet, galvanic metal
51 Interconnect between Metallic sheet (50) and substrate or epi-layer (47)

DRAWINGS—REFERENCE DESIGNATORS

Ref. Designator Description
Ant Antenna, electrically conductive wiring
A Wave Rectifier
B Wave Rectifier, alternate embodiment
C1 Polarized capacitor, charge storage element
C2 Coupling capacitor, AC coupled wave energy
C3 Coupling capacitor, AC coupled wave energy
C4 Capacitor, charge storage
C5 Capacitor, resonance frequency tuning
C6, C7 Capacitor, charge storage
CN Common node, wave rectifier B array
D1, D2 Diode, light emission
D3 Diode, rectification
D4 Diode, blocking current from flowing back into the rectifier array
DN Diode, light emission, plurality
Dblock Diode, blocking current from flowing back into pulse generator/oscillator
E Earth ground node
L1 Inductor, coupled with L2
L2 Inductor, coupled with L1
L3, L4, L5 3 Inductors, Tri-filar wound, coupled
Lamp Light emitter, gas
LOAD Electrical circuit, powered by Vout
N Negative
P Positive
U Antenna rectifier array and energy storage circuit
U1 Opto-coupler
U2 Voltage Regulator, power management circuit
U3 Micro-circuits, integrated circuits
UN Plurality of circuit blocks
Vcell Galvanic cell battery
Vp Positive electrode, Galvanic cell battery
Vn Negative electrode, Galvanic cell battery
Vout Pulse generator output voltage, drives load circuits
Vrechargeable Battery, rechargeable
Vst Voltage, stored, deliverable to a load circuit
X An arrayed plurality of wave rectifiers, A or B
R1 Current limiting resistor, Vcell loading
R2 Current setting resistor, U1 opto-coupler
R3 Current setting resistor, Q1 pulse generator/oscillator
R4 Current limiting resistor, battery charging
R5 Current limiting resistor, lamp illumination
R6 Current limiting resistor, speaker drive
R7 Current limiting resistor, Q1 base drive
Rp Photo (light) sensitive resistor
SG1, SG2 Switch, gas breakdown
SW1 Switch to disable Rp operation
SW2 Switch to disable U1 operation
SW3 Switch to disable Q1 operation
SW4 Switch to disable Rp operation
SW5 Switch to disable current to the Load
SW6 Switch to disconnect Vcell from circuits
Q1 NPN Transistor, pulse generator/oscillator
Y Load circuit, may emit light or sound
Zin Input node for the Load
Zspeaker Speaker impedance (speaker generates sound when driven)

DETAILED DESCRIPTION

The following detailed descriptions provide substantive instruction regarding how to make and use the numerous embodiments of the present invention. However, the invention may be practiced without some of these specific details. FIGS. 1 through 5 depict a plurality of interchangeable features and components. The embodiments and features may be combined or reduced, yielding a plurality of combinations and forms, some simple, and some complex.

Embodiments of FIG. 1

FIG. 1a depicts a side view of a galvanic cell containment vessel (Ref. Numeral 1), preferably made from a sturdy and substantially electrically insulating material such as High Density Poly-Ethelyene (HDPE) or similar plastic compounds, and preferably 6 to 24 inches in diameter and 6 to 24 inches in depth. The containment vessel may be visibly transparent, or opaque. It may also be made of glass, cardboard, or paper. Reference numeral 3 depicts general carry handle locations for picking up, placing, or removing, the containment vessel. Reference numeral 2 depicts a plurality of lower exit flow hole locations at the bottom of the containment vessel through which fluid, electrolyte, and soil may drain. While the exit flow holes may be located anywhere near the bottom of the device, they have preferably been dispersed in a symmetrical arrangement in the following diagrams, but substantial symmetry is not required in order for exit flow holes to function. Symmetry is aesthetically pleasing and presents uniform exit flow function. In alternate embodiments, a plurality of exit flow holes may be placed in asymmetrical arrangements. Exit flow holes may also be located along the lower sides of the containment vessel in symmetrical or asymmetrical arrangements.

FIG. 1*b* depicts a top view of a general containment vessel (1), once again showing approximate locations for carry handles (3) near the sides, and a general plurality of exit flow holes (2) near the bottom of the containment vessel. In an alternate embodiment, the carry handles may be positioned substantially lower on the containment vessel.

FIG. 1*c* depicts a side view of a substantially spiral-shaped coil, approximately 1 inch to 6 feet in diameter, but preferably about 12 inches in diameter. In a preferred embodiment, the spiral-shaped coil is the positive electrode for a galvanic cell and comprised substantially of copper. The spiral rings of the coil are spaced about % inch to 3 inches apart, but the spacing does not need to be substantially symmetrical or substantially uniform from spiral to spiral. In a preferred embodiment, the spiral ring spacing as approximately 1 inch between spirals. For handling ease and lower cost, it may be preferable to make the spiral coil that is approximately 6 inches to 18 inches in diameter. The spiral coil is preferably formed from approximately 5 to 20 feet in length of substantially hollow copper tubing and possessing substantial exposed surface area both inside and out of the hollow tubing. In an alternate embodiment, the spiral coil may also be formed using solid copper wire or copper mesh. The hollow copper tubing may possess an inside diameter of approximately $1/32$ inch to 2 inches, and the thickness of the copper may be approximately $1/32$ inch to ½ inch. Preferably the hollow tubing is about 10 feet in length, and has an inside diameter of approximately H inch and a thickness of about $1/16$ inch. This may yield a substantially compact and affordable spiral coil embodiment.

FIG. 1*d* depicts a side view of a general galvanic cell system including a general containment vessel (1). Reference numeral 5 depicts a metallic sheet, preferably the negative electrode. It is preferably comprised substantially of zinc. In an alternate embodiment the metallic sheet may be iron and substantially zinc plated for galvanic function. When formed, the metallic sheet substantially surrounds the spiral coil, but does not contact the spiral coil. The metallic sheet is preferably the negative electrode, but in an alternate embodiment of the galvanic cell, the polarities of the spiral coil and the metallic sheet surrounding the coil may be switched. The general position of the metallic sheet surrounding the spiral coil is depicted in FIG. 1*e*. The metallic sheet may reside about ¼ inch to 12 inches from the spiral electrode. Preferably the metallic sheet is distanced about 1 inch from the spiral coil rings. The spiral coil preferably forms the positive electrode of the galvanic cell, and the metallic sheet surrounding the spiral coil preferably forms the negative electrode.

Since the containment vessel is preferably made of HDPE or another form of electrically insulating plastic, the containment vessel is an electrical insulator and does not substantially affect the electrical operation of the electrodes. However, in an alternate embodiment the containment vessel may be substantially comprised of glass, metal, semiconductor material, carbon, cloth, cardboard, paper, or similar. For ease of assembly, and replacement, it may be preferable that the metallic sheet either contact the containment vessel or reside generally near it as shown. In an alternate embodiment there may be a substantial spacing between the containment vessel and the metallic sheet. This may be necessary 1*f* the containment vessel is comprised of metal.

To utilize the galvanic cell system, the containment vessel is filled with an electrolyte, preferably moistened-soil (reference numeral 10) thereby holding the spiral coil near the center region of the containment vessel and also keeping the spiral coil from contacting the metallic sheet surrounding it. It is not necessary that the spiral coil and metallic sheet be completely covered in moistened soil or electrolyte, but it is preferable to cover the two electrodes substantially and as much as is convenient for assembly and also making external electrical connections to the electrodes. Electrical connections to the electrodes may be made by welding, soldering, melting, clip leads, clamps, or similar. The entire galvanic cell system may be covered in soil. It may be substantially buried below ground in whole or in part, or it may be situated fully above ground on a patio, in a yard, on an elevated table, or similar. It is preferable that moistened soil (10) not contain substantial amounts of clay or rocks, as the clay and rocks may reduce the quality of the galvanic cell reactions. While it is preferable to use water moistened soil, wet sand or sea water may also be utilized instead of moistened soil in alternate embodiments.

Moistening soil (10) with water initiates electro-chemical reactions between the metals and the damp soil (electrolyte), and over about 1 to 48 hours the galvanic cell will increase in electrical output capability from the electrodes. When using untarnished and new metals, it may be preferable to wait at least 12 hours before using the galvanic cell system. This will yield the largest energy output from the cell.

It may be convenient and desirable to use the present invention outdoors where rain and other natural water sources exist. In a preferred embodiment, the fluid utilized in the galvanic cell is environmentally available water. As the containment vessel fills with water over time (due to rain water or other irrigating sources), a plurality of exit flow holes (ref numeral 2) near the bottom of the containment vessel serve to drain the galvanic cell system so that it does not become substantially over-saturated with fluid and degrade the galvanic cell electrolyte. The metals in the galvanic cell will accordingly corrode and degrade over many days and months, with the negative electrode sheeting (zinc) suffering a much more catastrophic corrosion and depletion, especially 1*f* substantially immersed in water, reactive liquids, or substantial moisture. Zinc is a much more sacrificial metal than copper. For this reason, it is desirable that the zinc sheet or zinc plating have a thickness of about $1/128$ inch to 1 inch. Preferably a zinc thickness of greater than $1/32$ inch is desirable in order to increase the longevity of the galvanic cell. As the electrical current output and power output from the galvanic cell system wanes over time, the metal components and electrolyte may be replaced or supplemented. The components may be re-used until they are substantially corroded or eaten away or structurally compromised to a point where they are ineffective. In circumstances where lowest cost is desired, thinner metal thicknesses and electrodes may be used. The surface areas of the metals are largely where the electrochemical reactions take place. Plated electrodes may be useful to reduce cost, but life expectancy may be less as the plated metal disappears from the electrodes and reveals the core material or core metal (such as iron). One may select metal thicknesses and metal platings based upon cost and complexity requirements for the galvanic cell system. It is preferable to use substantially uniform metal components for longevity and simplicity of the galvanic cell system. For example, substantially uniform zinc sheeting, and substantially uniform copper tubing. Metals other than copper and zinc may be alternatively used inasmuch as the galvanic cell voltage generated is usable for the end application.

FIG. 1e is a general top view for the galvanic cell system depicted in FIG. 1d

FIG. 1f is an alternative embodiment of FIG. 1e. Reference numeral 14 denotes a general location for a substantially voided region near the center of the spiral electrode. This substantially voided region may be useful to visually observe or monitor fluid or electrolyte level within the containment vessel, or useful to hold auxiliary electrical circuitry and associated connections, or to hold secondary galvanic cells or micro-chips or sensors, or to reduce the amount of soil (electrolyte) required to fill the vessel. This substantially voided region may be useful in any embodiments of the present invention. The voided region may lower the cost, weight, complexity, improve visibility into the fluid and water saturation levels, and make a galvanic cell system more compact with improved utility. In a preferred embodiment, this substantially voided region is substantially cylindrical in shape and comprised of a visibly clear plastic, clear HDPE, or glass. It may also be comprised of cardboard, paper, or similar. The cylinder may be either closed or open on either end. The diameter of the cylinder or tube may be approximately 1 inch up to the diameter (size) of the coil. The cylinder may or may not contact the spiral coil electrode. Preferably a clear plastic cylinder is utilized and approximately 3 inches in diameter and spaced approximately 1 inch from the spiral coil. The cylinder does not need to be visibly clear, but it is preferable in order to view the galvanic cell soil and fluid levels. In this way, the cylinder may or may not fill with water, soil, or electrolyte, depending upon whether the bottom of the cylinder is closed-off or open. While it is preferable that the lower end of the cylinder be closed off, either cylinder construction or configuration may work. In an alternate embodiment the bottom of the cylinder possesses holes in order to let substantial fluid pass into the cylinder but not soil. The cylinder may also serve to electrically isolate any housed electronics, secondary galvanic cell systems within the cylinder, or lighting systems placed within the cylindrical tube. The preferred configuration depends upon the galvanic system constraints and requirements.

FIG. 1g depicts a side view of an alternative embodiment with a removable fluid collection apparatus (reference numeral 11) at the bottom of the containment vessel. In a preferred embodiment the containment vessel of prior embodiments may be placed on top of this fluid collection apparatus. Fluid, electrolyte, and soil (10) may collect in region 7 of the fluid collection apparatus. Reference numeral 6 depicts a general and removable plug location which may be utilized as a pathway for fluid, soil, and electrolyte, or serve as a general out-flow port when fluid levels reach the plug elevation, as the collection apparatus (11) fills over time. For example, this may occur after a rain storm, or general fluid-filling of the galvanic cell system. This embodiment may have utility when using the galvanic cell above ground, or on a substantially flat surface such as a patio area. The embodiment may also be useful when burying the galvanic cell system in whole or in part, as the upper portion of the containment vessel may be lifted off of the fluid collection apparatus. The fluid collection apparatus (11) may be sized sufficiently and effectively large enough to accommodate the exiting of fluid expected to over-flow from the galvanic cell system. In a preferred embodiment the diameter of the fluid collection apparatus is approximately the same as the galvanic cell containment vessel base. In an alternate embodiment it is 1 to 10 times the diameter of the containment vessel base. In another alternate embodiment the fluid collection apparatus is made from visibly clear glass or transparent plastic so that fluid levels within it may be observed.

FIG. 1h is another alternative embodiment. The electrode sheeting surrounding the spiral coil now extends substantially underneath the spiral coil. In a preferred embodiment, the metallic sheeting extends at least 1 inch beyond the spiral coil. In another embodiment the sheeting extends to substantially close-off the bottom region and leave only a small gap near the center region of approximately 1/16 inch in diameter.

FIG. 1i depicts an embodiment wherein the electrode sheet extends both above and below the spiral coil. The extents of the sheet may be similar to FIG. 1h. This embodiment may be useful when pursuing maximum electrical resonance of the structure and maximum electrical current output from the galvanic cell system. Maximum resonance with the load circuit may be achieved when the negative electrode (zinc) substantially encases the positive electrode spiral (copper) at both top and bottom regions. The pulsed electrical output (voltage spikes) from the galvanic cell up-converter circuits (Vout) may increase in magnitude as the negative electrode sheet substantially extends both over and under the spiral electrode.

In order to achieve best operation and resonance from various galvanic cell embodiments, some experimentation may be required in order to find optimal configuration and performance for the galvanic cell system and its interchangeable circuits and components.

Figure 1K:
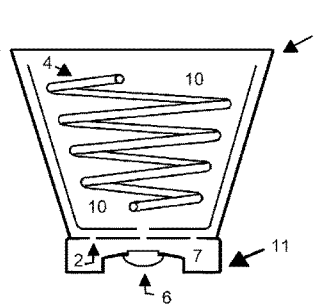
Figure 1L:
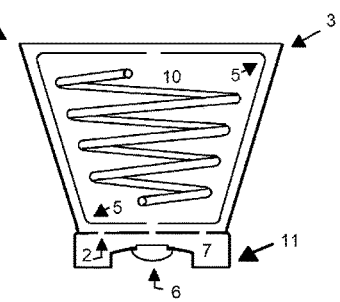

FIG. 1j depicts an alternate embodiment possessing a substantially conical shaped containment vessel, a substantially conical shaped spiral coil (preferably positive electrode), and substantially conical metallic sheet (preferably negative electrode) surrounding the spiral coil. In an alternate embodiment the positive a negative electrode materials and may be reversed.

The FIG. 1k depicts a general removable overflow apparatus at the bottom of the containment vessel. The electrode sheet extends substantially underneath the conical spiral coil.

In the embodiment of FIG. 1l the electrode sheet extends both above and below the conical spiral coil. In an alternate embodiment the sheet may extend only over the upper portion of the spiral coil. However, it is preferable to extend the sheet substantially over both ends of the spiral coil.

Figure 1M:
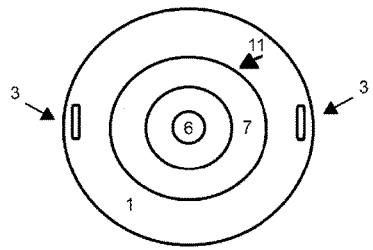
Figure 1N:
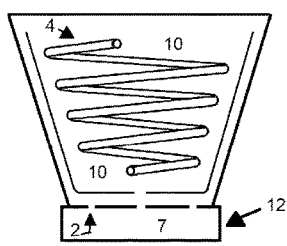

The embodiment of FIG. 1m depicts a general top view for overflow containment regions. The diameters displayed may be varied without departing from the scope of the present invention. A removable plug (ref. numeral 6) is depicted, and a containment ring (ref. numeral 7) resides inside the overflow containment apparatus (11). General handles for carrying and removal (3) are also depicted. In a preferred embodiment, the galvanic cell system may be placed on top of this overflow containment apparatus. In alternate embodiments, the overflow containment apparatus (11) is either temporarily affixed, or permanently affixed to the galvanic cell containment vessel. The diameter of the overflow containment apparatus may be substantially larger or smaller in diameter than the containment vessel. A larger diameter may serve to better stabilize the galvanic cell system and containment apparatus, and also hold increased fluid overflow. In alternate embodiments the overflow containment apparatus may be substantially comprised of a plastic, such as HDPE, or glass, and may be transparent enough to allow viewing of fluid level within it. This can assist in optimizing the life and operation of the cell by keeping the soil (electrolyte) moist but not over-saturated.

FIG. 1n details an alternate embodiment possessing a simplified removable overflow containment apparatus (12) at the bottom of the device. This embodiment may also possess the variables of the prior embodiment. To simplify the embodiment, there is no drain plug (6). The electrode sheet may also extend substantially beneath the conical spiral coil.

Figure 1O:
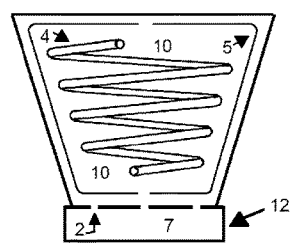

In the embodiment of FIG. 1o, the electrode sheet extends substantially both above and below the conical spiral coil. In alternate embodiments the sheet may extend either above, or below, as described in earlier embodiments.

Figure 1P:
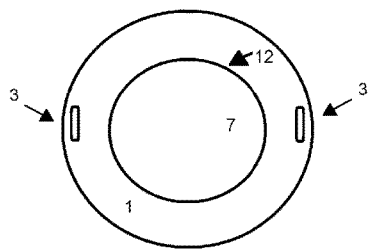

The embodiment of FIG. 1p depicts a top view for a simplified overflow containment apparatus and approximate diameters for implementation. The larger containment region (ref. numeral 7) is depicted inside the overflow containment apparatus (12). General handles for carrying and removal (3) are also depicted.

Components of the various FIG. 1 embodiments shown and described may be mixed and matched without departing from the scope of the present invention.

Embodiments of FIG. 2

Figure 2A:
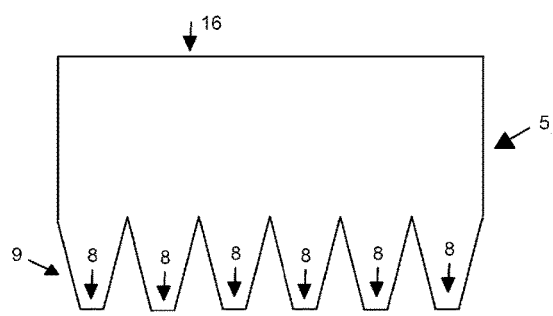
Figure 2B:
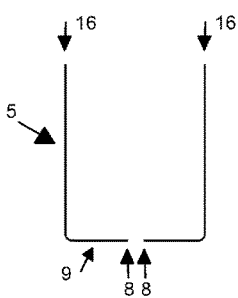
Figure 2C:
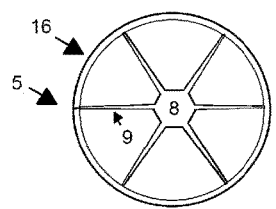

The embodiments shown in FIGS. 2a, 2b, and 2c, depict a general design and method for producing a formed electrode from a metallic sheet (preferably zinc) which generally fits within a containment vessel, or embodiments of FIGS. 1a through 1i. The upper edge of the metallic sheet is denoted as reference numeral 16, and possesses a plurality of flaps depicted on the bottom (reference numeral 8). In alternate embodiments, the number of flaps may be between 1 and a plurality.

FIG. 2b depicts a general side view cut-away (center cut) of the embodiment after forming into cylinder shape. The upper edge of the metallic sheet is denoted by reference numeral 16, and the side edge of the formed sheet denoted by reference numeral 5. The sheet is formed into a general cylinder shape. The metallic sheet may possess a plurality of flaps which are preferably folded at approximately 90 degrees in order to traverse underneath the spiral center coil of FIGS. 1a through 1i. This folded or bent region is denoted by reference numeral 9 and may be varied greatly, such as any angle between 0 degrees (unfolded) through 180 degrees (folded back against the cylinder wall). The metallic sheet does not need to completely close-off the bottom of the cylinder formation, and in a preferred embodiment a small gap in the center of about ½ inch diameter allows effective drainage. This can be seen as reference numeral 8 on the plurality of flaps. This functional gap allows fluid, electrolyte, or soil to pass out the bottom of the device. Without a small gap, fluid, electrolyte, and soil may not drain out the bottom of the containment vessel and standing water or fluid may collect and degrade the performance and longevity of the galvanic cell system.

FIG. 2c is a top view showing the upper edge of the sheet (16) and bendable flaps at the bottom (ref. numerals 9 and 8).

Figure 2D:
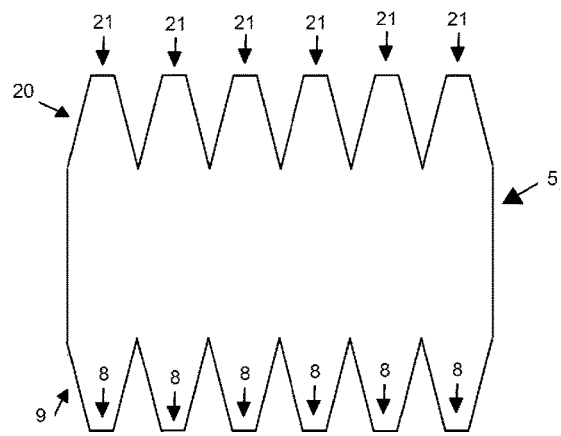
Figure 2E:
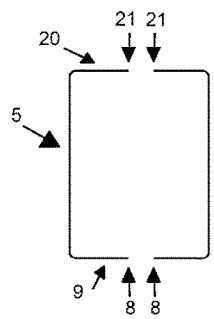
Figure 2F:
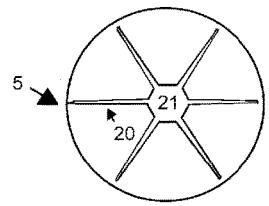
Figure 2G:
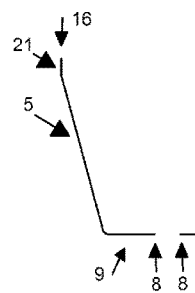
Figure 2H:
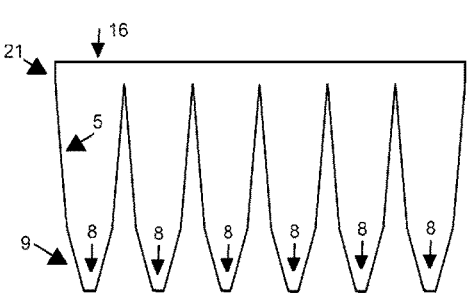
Figure 2I:
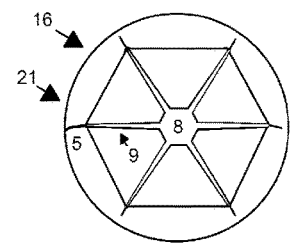
Figure 2J:
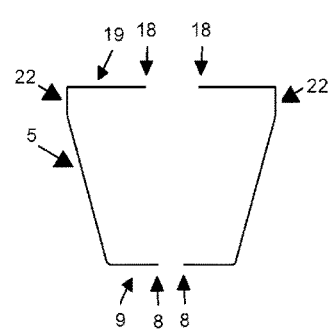
Figure 2K:
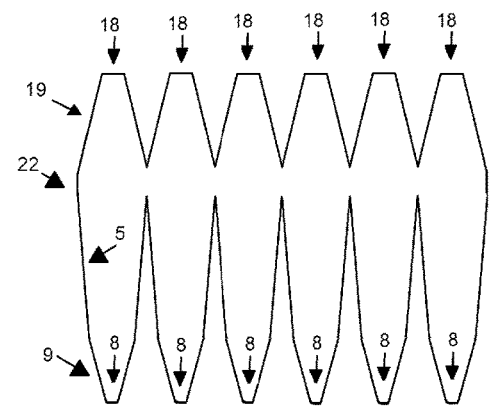
Figure 2L:
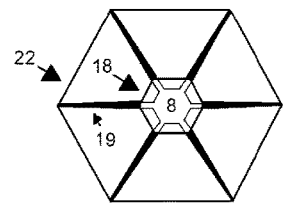

The embodiment shown in FIGS. 2d, 2e, and 2f, depicts an alternate design and method for a formed metallic sheet (preferably zinc) generally fitting a containment vessel, such as depicted in embodiments of FIGS. 1a through 1i. This metallic sheet contains a plurality of flaps both on the top and bottom (reference numerals 8, 9, 20 and 21), and is formed and bent in a similar fashion and form, with similar extent variances and flexibility.

FIG. 2e depicts a cut-away side view (center cut) after forming. The upper flaps of the metallic sheet are denoted by reference numerals 20 and 21, and the side edge of the sheet is denoted by reference numeral 5. The metallic sheet is generally formed into a cyclinder shape. The metallic sheet possesses flaps (both above and below the spiral coil) which are preferably bent at approximately 90 degrees to traverse both underneath and above the spiral center coil of FIGS. 1a through 1i. These bend regions are denoted by reference numerals 9 and 20 and the bend range may be between 0 degrees and 180 degrees similar to the previous embodiment. The metallic sheet may or may not completely close off the bottom or the top of the device. This can be seen as reference numerals 8 and 21 on the plurality of flaps. Preferably there remains a functional gap of about ¼ inch to 3 inches allowing fluid, electrolyte, and soil to pass out the bottom of the device, and also a ¼ inch to 3 inch gap at the top providing access to the galvanic cell system through the top region of the containment vessel. It is not necessary that the top and bottom gaps be the same extent or coverage or bend angle. Without a small gap at the bottom of the device, fluid, electrolyte, and soil may not drain out the bottom of the containment vessel and thereby prevent standing water and over-saturation of the cell. The flaps above and below the spiral coil may also help the galvanic cell system achieve more substantial resonance and electrical current output. In another embodiment, it is preferable that the gap be approximately 1 inch diameter at both the top and bottom of the device, providing both access to the top of the galvanic cell system, and drain relief at the bottom. The gap sizes are variable, and depend upon the requirements for the galvanic cell system. They may be different diameters at top and bottom.

FIG. 2f is a general top view depicting approximately 90 degree bent flaps at both the lower and upper regions (ref. numerals 8, 9, 20 and 21).

Embodiments of FIG. 3

Figure 3A:
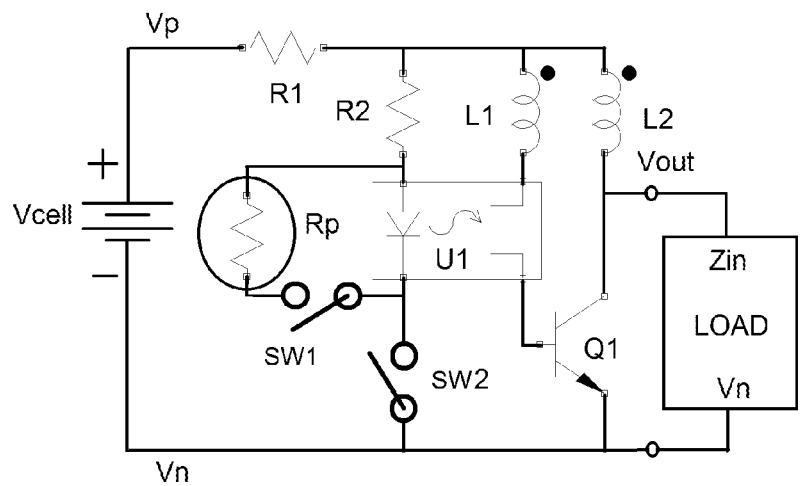

FIG. 3a presents a general schematic for a multi-featured voltage conversion circuit. In a preferred embodiment, the circuit is attached to a galvanic cell (Vcell) and the circuit up-converts the galvanic cell's low voltage DC to a pulsed AC output of between tens and hundreds of volts. This is desirable since the voltage output of the galvanic cell is generally less than 1 volt DC. It is therefore desirable to up-convert the voltage potential of the galvanic cell in order to do electrical work such as illuminating lights, sounding a speaker, powering a useful circuit block, powering miscellaneous circuits or a micro-chip assembly, charging a battery, transmitting communications, etc. In a preferred embodiment, FIG. 3a possesses a light sensitive resistor (Rp) to enable or disable electrical conversion from the galvanic cell. The light sensitive resistor may be activated by sunlight or a light source such as an LED, laser, bulb, gas, or similar light source. The resistance of photo-resistor Rp drops proportionally when light impinges it, thereby causing the pulsed AC output of the circuit to commence when substantial darkness occurs. The preferred operation of the circuit of FIG. 3a is also a function of the switch positions SW1 and SW2, and as follows:

SW1 SW2 Vout
open open OFF
closed open OFF
open closed ON (pulsing AC spikes)
closed closed ON in substantial darkness (pulsing AC spikes)

The switch positions of SW1 and SW2 allow turning OFF the galvanic cell draw and up-conversion circuits. In a preferred embodiment, resistor R1 is approximately 10 ohms but R1 may also be between 0 and 1000 ohms in alternate embodiments. Resistor R1 allows the circuit to be operated with a wider range of Vcell or general battery voltage levels, so 1f the up-converter circuit of FIG. 3a does not output pulsed AC spikes, then adjusting the value of R1 up or down may help the oscillations commence. FIG. 3a may be used with galvanic cell batteries or other types of batteries such as alkaline, nickel cadmium, lead acid, or similar. As such, the circuit may be utilized with or without a galvanic cell, such as with a small 1.5V AA or AAA sized cell. In a preferred embodiment FIG. 3a is powered with a galvanic cell. In an alternate embodiment FIG. 3a is utilized with Vcell provided by a one or a plurality of sealed batteries or alkaline batteries or rechargeable batteries. Resistor R2 sets the bias current through the photo-diode in U1 (optocoupler). R2 may be 0 ohms to 100K ohms depending upon Vcell applied to the circuit. In preferred embodiment, R2 is approximately 100 ohms but may need adjustment to maintain proper bias of the photo-diode in U1. When light impinges the photo-resistor Rp, the photo-resistor shunts electrical current around the photo-diode in U1, and stops bias of U1 thereby disabling the pulsed AC output of the circuit (Vout). This may have utility when the sun comes up, and when the sun sets. Switch SW1 can disable the photo-resistor Rp when SW1 is opened. Switch SW2 can disable the whole circuit when SW2 is opened. Coupled inductors L1 and L2 work in conjunction with transistor Q1 to create an oscillator and generate substantial periodic voltage spikes on Vout. L1 and L2 may be approximately 1 milli-Henry to 1000 milli-Henry in inductance, but preferably about 10 mH to 30 mH. L1 and L2 are preferably the same type of inductor and substantially same value. It may be preferable that L1 and L2 are largely unshielded so that they may substantially couple magnetically through the air into one another. Transistor Q1 is preferably an NPN bipolar transistor. In alternate embodiments Q1 may be selected from the group consisting of 2N2222, 2N3055, 2N3904, 2N5210, or similar in specification and gain. It may be necessary to optimize transistor selection and inductor sizing for largest AC spikes on Vout. Preferably, the oscillating pulse train on Vout should be between 1 KHz to 50 KHz and the voltage spikes on Vout of 50 volts or greater magnitude. This allows operation of a great many circuits and functions (depicted by the circuit block labeled LOAD). As such, Vout is connected to Zin of the LOAD circuit depicted, and also to Vn of the battery (Vcell) powering the circuit. Accordingly, the LOAD circuit must be designed to accept and utilize the spiked AC output on Vout. In an alternate embodiment, a plurality of FIG. 3a circuits may be connected to one or more galvanic cells. In other words, a single galvanic cell may drive a plurality of FIG. 3a circuits. The number of FIG. 3a circuits which may be powered by the galvanic battery (Vcell) are empirically determined. For example, when powering lights, the lights will dim when the loading is too great. In an alternate embodiment, the FIG. 3a schematic is simplified wherein R1=0 and both SW1 and SW2 are shorted, thereby effectively removing R1, SW1, and SW2 from the FIG. 3a circuit, and simplifying it. In yet another alternate embodiment, U1 may comprise an LED shining substantially onto a photo-resistor. As such, U1 may be effectively fabricated from a plurality of photo-responsive transistors, LED's, resistors, and similar devices. Depending upon performance needs and cost, one skilled in the art may opt for various alternate embodiments.

Figure 3B:
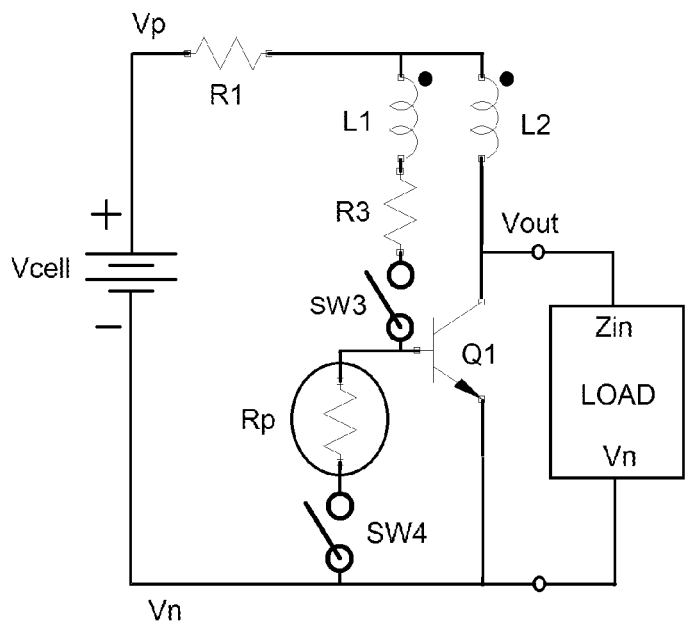

FIG. 3b is an alternate embodiment and operates similarly to FIG. 3a. R1, L1, L2, and Q1, of FIG. 3b work in similar fashions. Switch SW3 will disable Vout up-conversion when SW3 is opened. Switch SW4 will disable light controlled operation and control of photo-resistor Rp. Resistor R3 is selected in order to optimize operation of transistor Q1 base drive and also perform voltage division with resistor Rp. In a preferred embodiment, resistor R3 is approximately 0 ohms to 100K ohms. When resistor Rp is impinged with light from the sun or other desired source, the base of transistor Q1 becomes sufficiently un-biased so as to stop oscillation in the Q1, L1, and L2 circuit. In yet another alternate embodiment, switches SW3 and SW4 are shorted and may be removed from the circuit. This simplification can lower the cost of implementation. FIG. 3b depicts a LOAD circuit that in similar fashion and form to FIG. 3a, may be attach to Vout. As before, reasonable optimization of circuit resonance and oscillation parameters may be necessary for a particular galvanic cell system.

SW3 SW4 Vout
open open OFF
closed open ON (pulsing AC spikes)
open closed OFF
closed closed ON in substantial darkness (pulsing AC spikes)

Figure 3C:
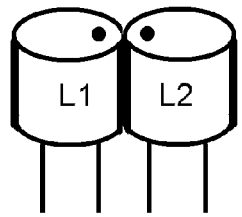

FIG. 3c depicts an approximate physical arrangement of two radial leaded inductors (L1 and L2) which may provide preferred and substantial coupling of magnetic fields between L1 and 12, thereby supporting up-conversion oscillation and substantial voltage spikes on Vout. In a preferred embodiment, radial leaded inductors L1 and L2 are placed substantially adjacent to one another as depicted. In alternate embodiments, the two inductors L1 and L2 may be spaced up to an inch a part and still couple enough magnetically to bring oscillation, albeit less. As such, substantial circuit oscillation is usually best achieved when radial leaded inductors L1 and L2 are placed substantially adjacent one another as depicted in FIG. 3c. This positioning of radial leaded L1 and L2 applies to the circuits in both FIGS. 3a and 3b. L1 and L2 are preferably unshielded radial leaded inductors and between 10 mH and 30 mH in value, but they may be substantially larger or substantially smaller, and of different individual inductances as long as effective oscillation ensues. The values of L1 and L2 may be empirically selected in order to create largest AC voltage spikes at circuit node Vout. In an alternate embodiment, L1 and L2 are comprised of general coils of magnet wire wherein the spiral geometries of the two coils are substantially coupled magnetically and the two coils are arranged between 0 to 180 degrees in Y-axis orientation with one another. Placement is effective when oscillation ensues. Preferably coils L1 and L2 reside in substantially the same orientation. One skilled in the art will appreciate orientations for coupling fields between inductive coils and also empirical adjustments for creating resonance and oscillation in the circuits of FIGS. 3a and 3b.

Figure 3D:
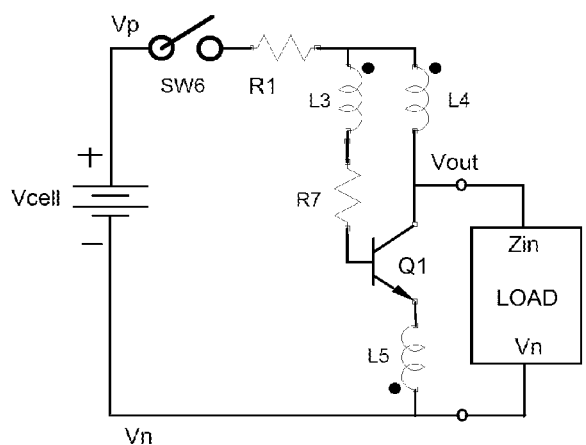

FIG. 3d presents a general schematic for a high frequency oscillator circuit. In a preferred embodiment, the circuit is attached to a galvanic cell (Vcell) and the circuit converts the galvanic cell's low voltage DC to a oscillating AC output frequency of between 10 KHz and 100 MHz on Vout. The oscillation may or may not be substantially sinusoidal, and in some embodiments the oscillation may resemble a smoothed saw-tooth wave. Resistor R1 serves to limit the current from the battery source Vcell, and also to fine tune circuit oscillation. R1 is preferably 0 ohms, but may need to be increased to between 1 ohm and 100 ohms for oscillation to ensue. The value of R1 may need to be adjusted versus Vcell battery type. For example, a 1.5V alkaline AA or rechargeable AAA battery may require about 10-20 ohms for R1. A galvanic cell may require 0 ohms for R1. Inductors L3, L4, and L5 work in conjunction with transistor Q1 to form an oscillator. Q1 may be a 2N3055, 2N2222, 2N3904, 2N5210, or similar high gain NPN transistor. In a preferred embodiment, inductors L3, L4, and L5 are comprised of a flat-wound tri-filar coil. The flat-wound coil may be fabricated any number of ways, but preferably from insulated 3-conductor Romex wire (12/3 14/3, 16/3, etc.) that is commonly utilized for 117 VAC home wiring, or 117 VAC outdoor wiring. The gauge wire may be between 10 gauge and 20 gauge, but is preferably 12-16 gauge, solid copper wire. A length of Romex of between 25 feet and 200 feet may be used, but 100 feet is preferable. Once the length of Romex has been wound into a flat-wound spiral, looking much like a pancake, the 3 conductors represent inductors L3, L4, and L5, in order. R7 represents a current limiting resistor for adjusting the driving of the base of transistor Q1, and may be between 0 ohms and 10K ohms. R7 is preferably 0 ohms, but may be adjusted upward 1f more sinusoidal wave shape is desired. R1 is adjusted upwards from 0 ohms until oscillation ensues on Vout. Oscillation on Vout may be between 50 KHz-10 MHz, and as such, these frequencies may be used for communications, signal transmissions, notifications, rodent or pest deterrence, dog repulsion, either in the earth or in the air. The oscillations on Vout may also be modulated or chopped by LOAD circuits using common methods. As with the prior embodiments, the circuit of FIG. 3d may also be modified to include a switch (SW6) in order to turn ON or OFF the circuit operation. For example, a single-pole single-throw switch (SW6), may be placed in series with R1 in order to enable or disable current from Vcell into the circuit. Inductors L3, L4, and L5 may also be formed from wire other than insulated solid copper wire in Romex, such stranded wire, or tri-filar stranded and insulated copper wire 8 gauge to 40 gauge. Magnet wire may also be used. Romex is preferable due to its low cost, inherent bi-filar or tri-filar configurations, ease of winding into a flat-wound coil, and ability to be easily positioned as an antenna or emitter in the air or in the earth. Preferably the flat-wound coil of Romex is approximately 1-2 feet in diameter. It may be buried, or placed above ground. It may be used to ward off rodents in the ground, repulse dogs, send communication transmissions, alerts, or modulated notifications or communications to others via radio wave transmission. In an alternate embodiment, the AC oscillations may be rectified and converted to DC for similar uses and transformations as earlier embodiments in this specification. One skilled in the art will appreciate the utility and variations.

Figure 3E:
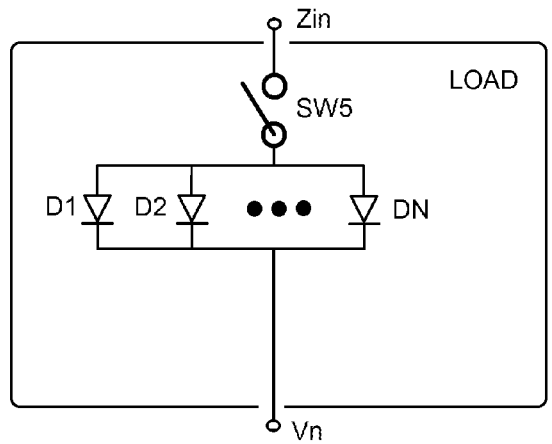

FIG. 3e represents a LOAD circuit which may be attached to the FIG. 3a, 3b, or 3d circuits. Vout is connected to the Zin node of the LOAD circuit. Vn of the LOAD circuit is connected to the negative electrode of the galvanic cell or battery (Vcell). When switch SW5 of the LOAD circuit is closed, the voltage driver output (Vout) of FIG. 3a, 3b, or 3d, pulses current through the parallel array of diodes which are labeled D1, D2, through DN. DN represents a plurality of diodes. In one embodiment, a plurality of diodes may be Light Emitting Diodes (LED's). As such, when large voltage excursions appear on Vout, this forward biases and illuminates the LED's in a quick burst. Since repetitive bursts may occur at a rate of approximately 1 KHz to 50 KHz and beyond, the individual pulse train is not observable to the human eye. The light emitted appears to be continuous. This LOAD circuit is well suited for using the same type of diode in plurality. For example, 1f all diodes are white LED's then this circuit will work well. Laser diodes may also be utilized in another embodiment. Using diodes with substantially different forward bias voltages may be problematic here since the diodes with substantially higher forward bias voltage may not get appreciably biased. The following embodiment of FIG. 3f resolves this shortcoming.

Figure 3F:
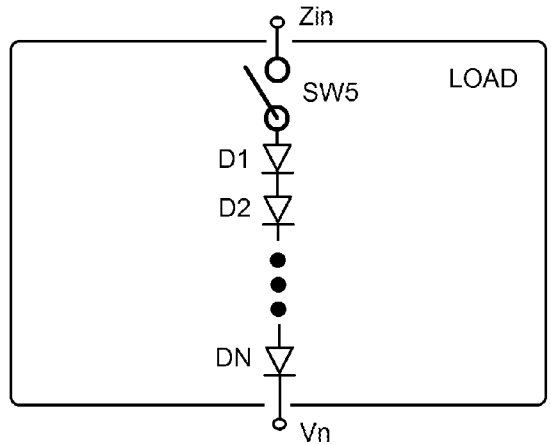

FIG. 3f presents an alternative embodiment of FIG. 3e wherein the plurality of diodes D1, D2, through DN, may be stacked in series instead of parallel. The overall affect of voltage excursions on Vout through the diode circuit is the same. A voltage spike through the series diodes creates a burst of light 1f the diodes are LED's. In an alternate embodiment, none, some, or all of the diodes may be LED's, or different color LED's. Laser diodes may also be used in another embodiment. This circuit may be useful when diodes with substantially differing forward bias voltages are used, such as when utilizing multiple colors of LED's, or when driving infrared or ultraviolet LED's at the same time as other color LED's. All colors of LED's may be driven at once without their different forward bias voltages substantially affecting the others. This may be useful for Christmas lights, full spectrum lighting, or colorful light decorations. Ultraviolet LED's may also be useful to kill off micro organisms. Infrared LED's may be useful for creating invisible light beams for communications, trip sensors, or general IR illuminations of organisms or objects. The forward bias voltages of all LED's must not exceed the magnitude of the Vout voltage peak. If so, the LED's may not illuminate substantially, or at all.

Figure 3G:
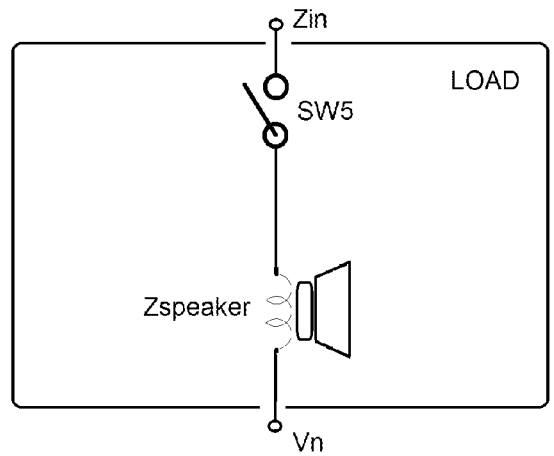

FIG. 3g depicts an alternate embodiment where the LOAD circuit is comprised of a speaker or plurality of speakers. The speakers may be of ultra-sonic type, or audio type. Since the Vout voltage pulse train from the driver circuits of FIGS. 3a, 3b, and 3d, may be varied, it is possible to create sonic bursts at between approximately 100 Hz and 50 KHz. Ultra-sonic sound may be useful to ward off pests, or rodents, or dogs. Alternatively, audible sounds may be useful when an infrared light beam has been crossed or broken. As such, multi-toned galvanic cell systems may be utilized to make outdoor motion detection systems. It is possible to combine in series or parallel these numerous LOAD circuit embodiments. It is possible to attach a plurality of FIGS. 3a, 3b, and 3d, driver circuits to a single galvanic cell or plurality of batteries such as alkaline or nickel cadmium or lead acid. The variations are numerous.

Figure 3H:
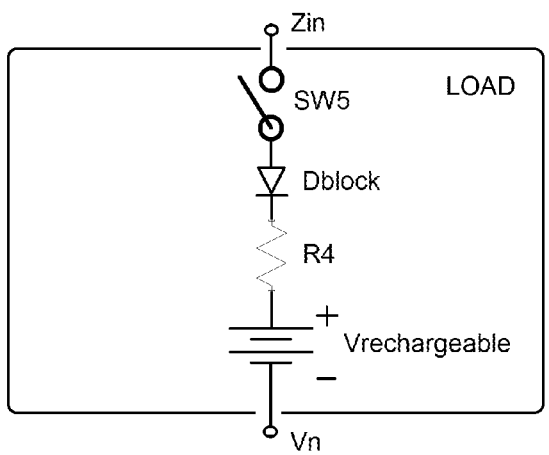

FIG. 3h depicts a LOAD circuit which may be useful to refill a rechargeable auxiliary battery. For example, one might trickle charge a 12V car battery over many days using the high voltage spikes from Vout. When switch SW5 of the load circuit is closed, the Vout voltage spikes from the driver circuit will pulse current through the blocking diode (Dblock) and through current limiting resistor R4, and into the rechargeable battery. The blocking diode (Dblock) prevents the rechargeable battery from pushing current back into the driver circuit Vout node. In this way, the low voltage DC of the galvanic cell may be up-converted via the Vout voltage spikes of the driver circuit and charge a battery. This circuit may charge a battery of any voltage such as a 1.2V nickel cadmium cell, or a 36V cell, or greater. As long as the voltage spikes on Vout exceed the rechargeable battery voltage then electrical current will flow into the rechargeable battery and charge it, albeit slowly. Once the battery is charged to the appropriate voltage level, it should be removed from the charging circuit. Since the voltage spikes from the driver circuit (Vout) can be in the realm of volts to over a hundred volts, multiple 12V batteries could be stacked in series and charged. Possibilities for the system are again numerous.

Figure 3I:
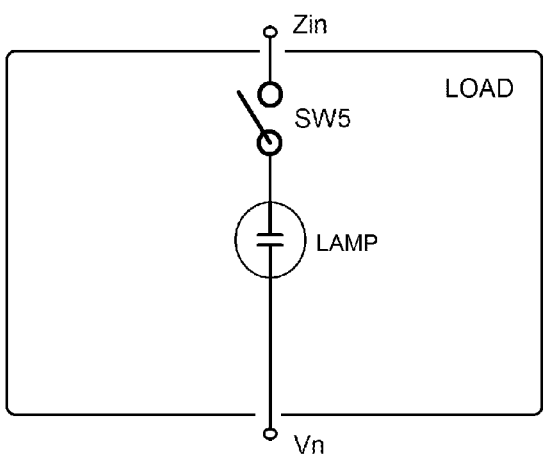

FIG. 3i displays an embodiment where a gas bulb or gas lamp may be excited (illuminated) by the Vout voltage pulses of the driver circuits in FIGS. 3a, 3b, and 3d. When switch SW5 is closed, the voltage pulses on Vout are applied to the gas bulb or gas lamp. A gas such as neon may be useful here, since it breaks down near 80 volts and emits light.

Embodiments of FIG. 4

FIG. 4a depicts an antenna rectifier circuit (A), and an array of them (X) interconnected. To operate the circuit, array (X) is connected to an antenna. The received electricity from the antenna is coupled through capacitor C2 to the rectification diodes (D3) and stored across capacitors labeled C1. C2 may be a ceramic capacitor of value 0.01 uF to 1 uF, but preferably about 0.1 uF. Alternatively C1 may be mylar, poly-propalene, mica, polystyrene, or similar. C1 may be an electrolytic capacitor of value between 0.1 uF and 10000 uF, but preferably 10 uF to 100 uF. C1 is preferably placed in the circuit in reverse polarity (as shown) to the C1 capacitor case marking. The array (X) of rectifiers serves to raise the stored DC voltage since the plurality of C1 capacitors of array X are stacked in series. In a preferred embodiment, capacitor C1 is electrolytic and installed in circuit A in reverse polarity. This reverse installation is not obvious, and energy (voltage) is stored on the electrolytic capacitor in a polarity opposite to the marking on the capacitor. The amount of voltage stored across capacitor C1 is a function of the signal amplitude received and rectified from the antenna. This is why stacking a plurality circuit block A is necessary in order to achieve hundreds of volts DC stored potential on array X. It is preferable to stack circuit A in an array of between 10 to 1000 elements in order to create antenna rectifier block X. If the antenna receives substantial energy upon it, then a smaller array of circuit A may suffice. Illuminating a neon bulb can require approximately 80 volts, so 1f this is the task at hand, then the array (X) will need to be sufficiently numerous in order to create a stored voltage great enough to breakdown the neon gas. It may take array X a plurality of seconds in order to charge up and achieve this magnitude of stored voltage.

If the circuit does not appear to be charging sufficiently, it may be necessary to disconnect all loading upon array X while the antenna is charging the array. For example, a digital multi-meter or test probe may problematic and load the array X circuit thereby inhibiting its proper operation and rectification. If array X does not achieve tens or hundreds of volts stored on the C1 capacitors, then one may need to either change the antenna orientation or height, or add more antenna element A units to array X, or momentarily remove multi-meter test probes or test circuits loading array X.

FIG. 4b represents an alternate embodiment. The coupling capacitor C3 leading from the antenna may be a ceramic capacitor of value 0.01 uF to 100 uF. Preferably it is about 1 uF to 10 uF. As with the prior embodiment of FIG. 4a, C3 may be poly-propalene, polystyrene, mica, mylar, or similar. A plurality of circuit block B are interconnected to achieve the desired stored DC voltage potential on capacitors C1 in array X.

FIG. 4c presents a circuit and connections to interface with circuit array X. The antenna is connected to node P, and node E is connected to Earth ground preferably via a copper rod which has been inserted at least a few inches into Earth ground soil. In this configuration, the antenna receives and rectifies the voltage difference between Earth ground and the elevated antenna. Component SG1 represents a Switched-Gas such as a neon gas bulb or similar. SG1 may also be comprised of a Spark Gap device. When voltage across SG1 is high enough, arcs through the gas or across the spark gap ensue, thereby charging capacitor C4 in bursts. C4 can be comprised of any type of dielectric composition or form, but it is preferably a ceramic, mylar, polypropalene, mica, or polyester, capacitor of value between 1 uF to 1000 uF, and preferably possesses a voltage rating of 300 volts or greater. As the rectifier array of X charges and exceeds the breakdown voltage of the spark gap or switched-gas bulb (SG1), an arc will occur and current will flow from array X through diode D4 and into capacitor C4. C4 charges in this pulsed fashion. C4 may charge to hundreds of volts depending upon the output of array X. It should be noted that in some cases disconnecting diode D4 from node P may be necessary in order to get array X to charge substantially. As mentioned previously, array X may not charge substantially unless all digital multi-meter test probes, test loading, or test connections are removed. In an alternative embodiment, the spark gap or gas bulb SG1 could be replaced with the switchable load circuits of FIG. 3e or 3f wherein when the forward bias voltage of the diode array in the LOAD is exceeded, array X will discharge into capacitor C4 and charge it. Capacitor C4 may take a substantial amount of time to charge whether utilizing a spark gap, or switched-gas, or diodes, to control the discharge event, especially 1fC4 is many hundreds of uF in size. Reference designator Vst in the circuit represents the stored voltage on capacitor C4. Circuit block U may be connected to any, some, or all of the embodiments of FIG. 4d in order to do useful operations. Circuit block U may also be connected to any, some, or all of the LOAD embodiments of FIG. 3. In an alternative embodiment, the circuits of FIG. 3a, 3b, or 3d, may be used to drive the antenna node of circuit block U and operate it without an elevated antenna. In this fashion, a low voltage galvanic cell and the voltage spikes (oscillations) on Vout of the up-converter in FIGS. 3a, 3b, and 3d, may drive the antenna node of circuit block U and thereby create up to hundreds of volts stored on capacitor C4.

The three embodiments of FIG. 4d may be connected individually or in parallel to circuit block U. The first embodiment in FIG. 4d possesses a LAMP means (preferably a gas such as neon) and current limiting resistor R5, and can be useful to produce a large and prolonged burst of light. This may be useful for implementing elevated visual notifications, lighted decorations, or warnings. The second embodiment in FIG. 4d displaying blocks U2, U3 and UN, depicts a plurality of micro-circuit blocks which may be used to further rectify or regulate or process the voltage stored on capacitor C4 in order to power other micro-circuits such as analog and digital circuits useful to do operative works. The third embodiment of FIG. 4d comprises a speaker or speakers and capacitor C5 which may be utilized to make an audible sonic tone, ultra-sonic tone, tones, or sonic bursts. SG2 represents a Spark Gap or Switched Gas acting as a switch, such as neon gas. Upon spark gap arcing or gas breakdown, the flowing electricity excites the speaker with a pulse of electrical current to make sonic tones or notes or acoustic wave transmissions. Connecting all 3 embodiments of FIG. 4d in parallel with circuit block U may be useful to perform a plurality of useful operations in parallel. However, when doing so it may be necessary to adjust various circuit values and parameters in order to achieve optimal performance from blocks U and Y. The multiple circuit blocks presented in this disclosure may be connected in series or parallel configurations and orientations.

FIG. 4e depicts antenna placement with circuit blocks U and Y. If circuit blocks U and Y are elevated, then node E must be electrically routed downward to Earth ground and preferably to a copper rod inserted into the ground at least 3 inches. The antenna (23) is preferably elevated at least 5 feet above ground, but the antenna may be elevated to any height. Higher is generally better. The antenna may be comprised of any electrically conductive wire such as standard coax cable. In a preferred embodiment, simple and inexpensive coax cable may be utilized, wherein either the center copper conductor or the stranded wire shielding of the coax may be utilized as the antenna length. The antenna length may be between 1 and 10000 feet, but preferably the antenna is approximately 50-100 feet long. The antenna may be substantially shorter or substantially longer.

FIG. 4f depicts an alternate embodiment wherein the antenna (24) hangs substantially downward and is substantially vertical in orientation. Conversely, in an alternate embodiment the antenna may point up and be raised substantially vertically, as opposed to hanging down. Coax cable may also be utilized in this embodiment, or similarly conductive electrical wire.

FIG. 4g represents an alternative embodiment wherein the antenna may be in the form of a substantially helical coil, or a substantially flat-wound coil. For example, 100 feet of coax cable may be wound into a helical coil formation that is approximately 1 foot in diameter. Coax may also be wound into a flat-wound coil configuration. So may Romex cabling of any gauge. FIG. 4g depicts the antenna coil in a substantially vertical orientation, but the coil may alternatively be in a substantially horizontal orientation or any angled variance thereof. In embodiments 4e, 4f, and 4g, substantially elevating the antenna may help yield best operations from the antenna array X. Faster flashing or bursting of the spark gap or gas bulb will make evident that more signal is being received by the antenna and electrical charge stored on array X.

Figure 5A:
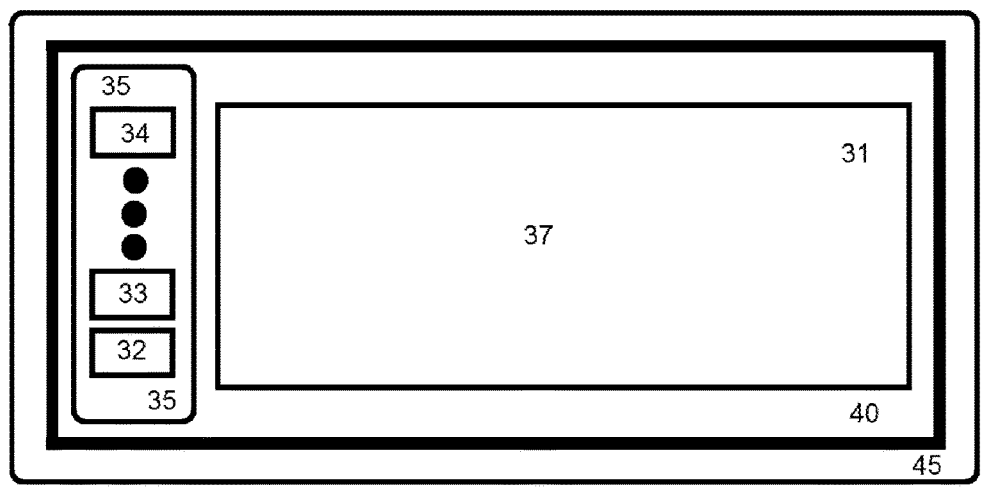
Figure 5B:
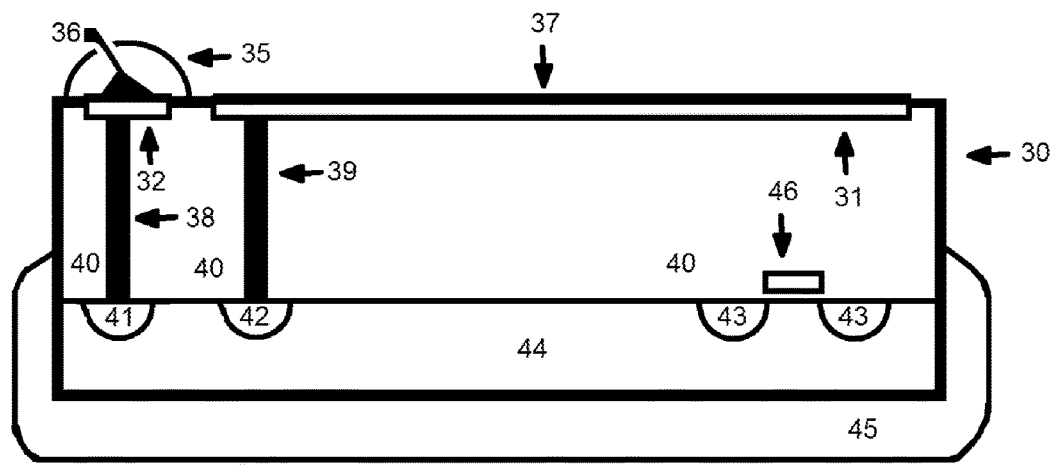
Figure 5C:
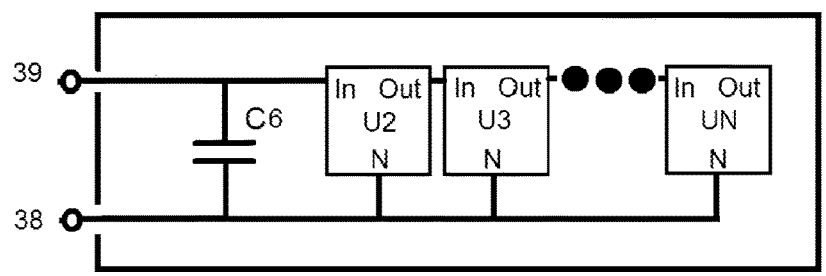
Figure 5D:
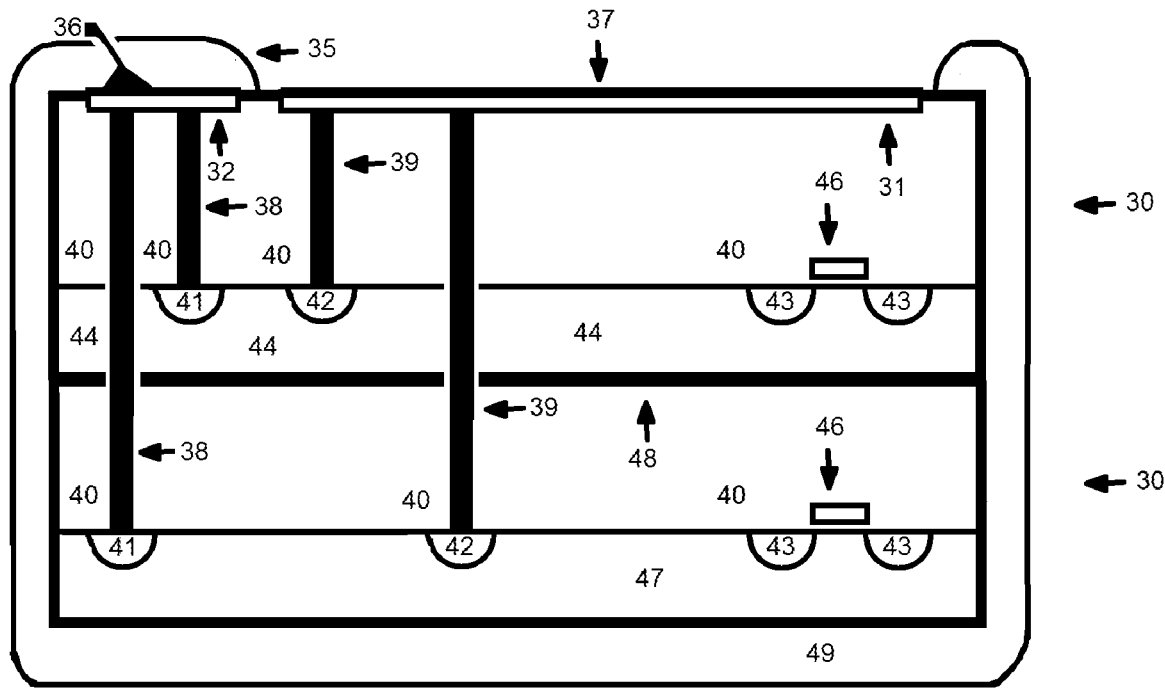
Figure 5E:
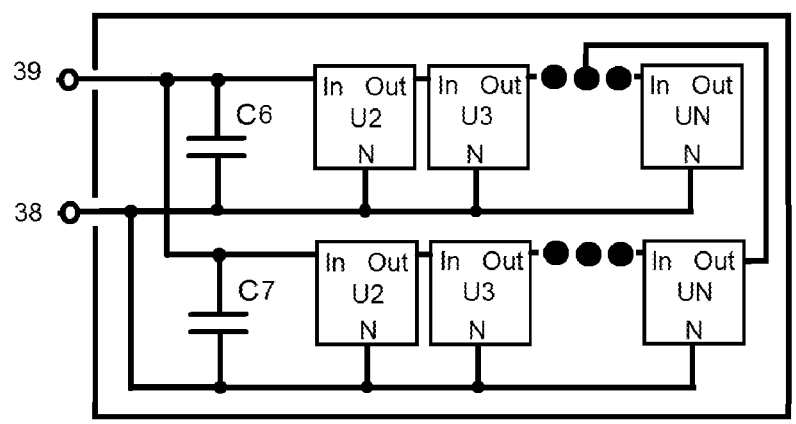
Figure 5:
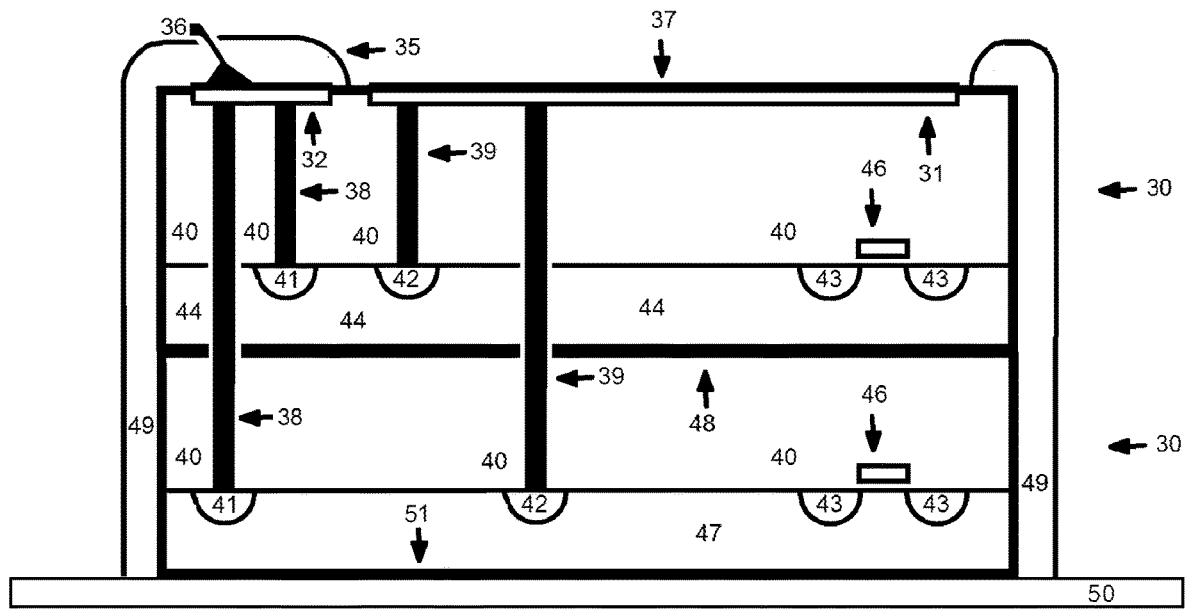
Figure 5:
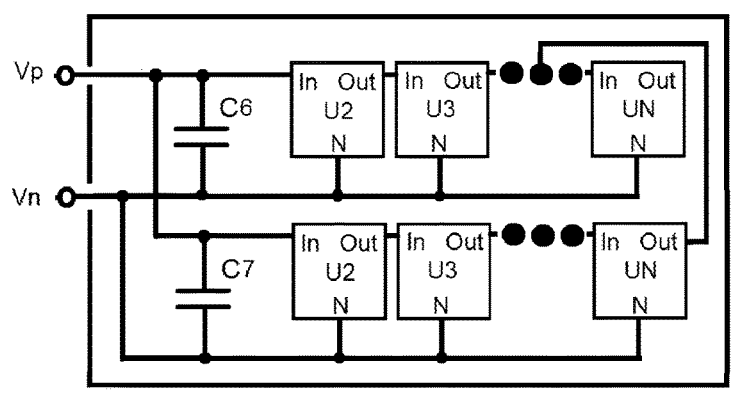

Embodiments of FIG. 5

FIG. 5a depicts a top view of a galvanic powered micro-chip (ref. numeral 30). Tungsten, aluminum, and copper are commonly used in micro-chip fabrication processes in order to form the interconnecting metal layers over the semiconductor devices below. Copper is useful as a positive electrode for a galvanic cell, but other metals may be used. In a preferred embodiment, copper or a metal substantially comprised of copper, is utilized to form a metal plate area (ref. numeral 31) on the top surface of the micro-chip. The plate area may be relatively small versus the top surface area of the chip, or relatively large versus the top surface area. In a preferred embodiment the normal silicon dioxide and silicon nitride insulating surface layers are removed or substantially un-fabricated, leaving the copper or upper metal layer exposed for use as a galvanic cell electrode. In an alternate embodiment there may be a plurality of surface modifications fabricated in the copper surface or top surface metal plate. These surface modifications may take the form of slots, squares, circles, ovals, or variations thereof. These surface modifications may be done to comply with foundry metal density limitations or rules for wafer fabrication, or to increase exposed surface area for galvanic reaction with electrolytes. The surface modifications may be placed across the entire metal surface area, or just a portion thereof.

A plurality of bond pads are depicted with reference numerals 32, 33, and 34. Bond pads may be utilized to electrically connect the micro-chip circuits with external circuits, devices, or systems, including supplemental or primary galvanic metals. An electrically insulating encapsulant such as glue or epoxy or a form of glass, may be applied over the bond pads and also the associated bond wiring interconnects (ref numerals 35 and 36) to electrically isolate and protect portions of the micro-chip and interconnect wires from corrosion or interaction with the galvanic electrolyte. The electrically insulating encapsulant or covering (such as epoxy or glue or a form of glass) may also be applied to cover the semiconductor substrate and epitaxial layer structure (ref. numeral 45). The micro-chip assembly may then be substantially impervious to placement in water-moistened soil, sea water, or other effective electrolyte fluid, and only the copper or metal plate (37) will react substantially with the electrolyte fluid, moistened soil, or sea water. In an alternate embodiment, it may also be necessary to similarly encapsulate, coat, or cover metal wiring connecting the micro-chip to other circuits (36) or galvanic metals or devices so as to isolate them from substantial galvanic reactions with dampened soil, sea water, or electrolyte solutions.

In an alternate embodiment, an aluminum or tungsten plate is also exposed on the surface of the micro-chip with said aluminum or said tungsten forming the negative electrode for the galvanic cell. Aluminum or tungsten may serve as the negative electrode (Vn) of the galvanic cell, or other like-metals may be used instead. Copper may serve as the positive electrode (Vp) of the galvanic cell, or other like-metals may be used. Having multiple exposed metals on the upper micro-chip layer structure negates the need to have external metallic sheets or external masses of galvanic metals to power the micro-chip. Since copper and aluminum may be fabricated on different layers of the micro-chip, it may be necessary to remove any silicon dioxide or silicon nitride covering these metallic layers in the micro-chip stack so that they may be exposed for galvanic cell use. For example, copper may be the upper most metal layer on the micro-chip, and aluminum may reside in a layer below the copper, therein separated by a silicon dioxide insulation layer. As such, these metallic plates or metal masses may be fabricated substantially adjacent to one another in different layers so that they may both be exposed (37) for galvanic cell use.

In an alternate embodiment of the invention, only an aluminum plate is fabricated on the top surface of the micro-chip. As such, an external mass of more positive metal (such as copper) may be needed to act as the positive electrode and electrically connected to a bond pad on the micro-chip for Vp interconnect to the micro-circuits below.

In all previously described embodiments, the metals may be comprised wholly or merely substantially of aluminum, tungsten, zinc, copper, and similar.

Either the Vp metal may reside exposed on the micro-chip, or the Vn metal may reside exposed. In an alternate embodiment, both metals may lay exposed on the micro-chip (37). One skilled in the art will recognize that not all micro-chip fabrication processes offer copper layers, and this detail may drive where and how Vp and Vn metals are implemented. The micro-chip fabrication processes may also determine whether aluminum or tungsten may be used.

Electrolyte reactions with the exposed surface regions of the galvanic metals will determine to a large extent how much electricity may be generated, stored, and used by the micro-chip circuits. That said, external metal sheets or external metal masses may also be connected or supplemented in order to generate more electricity for micro-chip storage and functional operations. External metal sheets or masses may be accordingly connected to the micro-chip bond pads or circuits to provide additional galvanic generated electricity to the micro-chip circuits. The galvanic cell may also be supplemented by a secondary battery type including alkaline, nickel cadmium, lead acid, or similar.

Stacking a plurality of micro-chips may present these same trade-offs and features. In an alternative embodiment, a micro-chip possessing copper layers may be stacked on top of a micro-chip possessing aluminum layers, thereby providing exposed aluminum and exposed copper for galvanic reactions on the stacked chip assembly. The chips may be stacked in same physical orientation, or alternate physical orientation, such as face to face, back to back, or back to face.

FIG. 5b depicts a side view for a galvanic powered micro-chip assembly. Metallic vias are depicted with reference numerals 38 and 39. They may be comprised of tungsten, or other suitable metal for interconnect. A plurality of vias may be used for interconnect within micro-chips. Vias may be fabricated using tungsten, aluminum, copper, zinc, or other metals available to the interconnection process and fabrication. Vias are a commonly a means to pass electricity and electrical signals between micro-chip layers, and also to pass electricity and electrical signals to a plurality of circuits (ref. numerals 41, 42, and 43) implanted into the semiconductor substrate or epitaxial layer (ref. numeral 44). Reference numeral 46 depicts an example transistor Gate of a CMOS transistor placed accordingly between Drain and Source diffusions or contacts. A plurality of transistors may be fabricated in a micro-chip or in a micro-chip stack.

Transistors may be fabricated as Metal Oxide Semiconductor Field Effect Transistors (MOSFET's), Bipolar Junction Transistors (BJT's), Insulated Gate Bipolar Transistors (IGBTs), Junction Field Effect Transistors (JFET's), Fin-shaped Field Effect Transistors (FINFETs), Carbon Nanotube Transistors (CNT's), and any other known transistor type. They may be mixed in any manner for use on or in the micro-chips.

FIG. 5c depicts a block diagram and general circuit flow architecture for a galvanic powered micro-chip. It is merely one example of a circuit flow, and other reasonable flows may also be implemented. In this embodiment, a metal plate (such as copper) near the micro-chip surface (37) may be interconnected below using vias (39) leading to one or a plurality of capacitors (C6) and integrated circuits below. This metal plate is the positive electrode of the galvanic cell (Vp). Conversely, the negative electrode (Vn) may be routed to circuits below using vias (38) and lead to similar capacitor arrangements and quantities, as well as integrated circuits. The negative electrode node may be a metal such as zinc or aluminum or tungsten which is more negative than the Vp metal (such as copper). The Vn metal may or may not be external to the micro-chip. In an alternate embodiment, the aluminum or tungsten or zinc may be affixed to the surface of the micro-chip using epoxy or similar adhesives or eutectic attachment means. Any of the galvanic metals may be perforated or slotted. Metals may be wholly or just substantially copper, zinc, aluminum, tungsten, or similar.

In much the same way that the various galvanic cell components of FIG. 1 could be formed and utilized, a micro-chip assembly or chip stack may also be placed in water moistened soil, sea water, or functional electrolyte solutions, and surrounded in whole or in part by zinc or aluminum or tungsten sheeting (negative electrode). Copper tubing or copper sheeting may also be placed similarly. A galvanic powered micro-chip may be used in conjunction with the embodiments of FIG. 1 through 4, or in a derivative form. A containment vessel for a galvanic powered micro-chip or chip stack may have a plurality of similar features as depicted in the embodiments described for FIGS. 1 through 4.

The negative electrode surface area may be 1 to 10 times the surface area of the positive electrode (such as copper), but it can also be substantially more or substantially less without departing from the spirit of the invention. Sizing of surface areas boils down to how much electricity is required, the life of the device, the size of the device, the cost of the device, and the complexity of the device. One skilled in the art will appreciate the trade offs. Galvanic cells may be formed from numerous different metals as long as a usable voltage difference exists between them. The relatively small DC voltage difference of a galvanic cell may then be up-converted or down-converted in voltage, and also regulated for appropriate use by electrical circuits.

Capacitor C6 denotes a storage element or elements either within the micro-chip structure or external to the micro-chip. C6 stores electrical charge from the galvanic cell and thereby feeds the up-conversion, down-conversion, or regulation circuits depicted in circuit block U2. These conversion and regulation circuits may be designed into the micro-chip and thereby be connected to a plurality of other circuits in the micro-chip depicted by U3 and UN. The voltage and current required to power a micro-chip varies with semiconductor process and circuit architecture. The up-conversion, down-conversion, and regulation circuits are optimized to take the electrical energy stored in C6 and create the voltage levels necessary to power the micro-chip and various associated circuits, either on the micro-chip or off of it.

FIG. 5d depicts a side view of a galvanic powered micro-chip stacked assembly. The assembly may comprise a plurality of micro-chips in the stack-up. They may be stacked face to face, back to back, or face to face. The face (top) being the upper most metal layer or silicon dioxide layer or silicon nitride layer, and the back (bottom) being the bottom most semiconductor layer. The chips may be fabricated using different semiconductor processes offering metals such as copper, aluminum, tungsten, zinc, or other metals useful. Metallic vias are denoted with reference numerals 38 and 39 and depict an example of a plurality of vias which may be utilized to pass electricity and signals between micro-chip stack layers and various circuit blocks. Vias may be fabricated with tungsten or aluminum or copper or zinc or other metals sufficient to form via interconnects between metal layers and chip stacks. Vias may pass electricity and electrical signals to a plurality of circuits (exemplified by ref. numerals 41, 42, and 43) implanted into the semiconductor substrate or epitaxial layer (ref. numeral 44). Reference numeral 46 depicts a transistor gate of a complimentary MOSFET transistor. A plurality of gates and transistors may reside on each micro-chip. Reference numeral 46 refers to an example of one transistor, but there may be a plurality of transistors on the micro-chips. Transistors may be fabricated as Metal Oxide Semiconductor Field Effect Transistors (MOSFETs), Bipolar Junction Transistors (BJT's), Insulated Gate Bipolar Transistors (IGBTs), Junction Field Effect Transistors (JFETs), Fin-shaped Field Effect Transistors (FINFETs), Carbon Nano-tube Transistors (CNTs), and any other known transistor type. Micro-chips of any type of semiconductor fabrication process may be stacked on top of one another. Reference numeral 48 depicts an example boundary region or surface of contact between first and second stacked micro-chips. A plurality of stacked chips will accordingly possess boundary regions (48) between stacked chips. As with the embodiments described for FIGS. 5a and 5b, the stacked micro-chips may also possess multiple exposed surfaces, such as copper, aluminum, tungsten, zinc, or other metals useful for substantial galvanic reactions. Galvanic metals may also reside off-chip or on-chip. The off-chip metals may wholly power the chips, or merely supplement the on-chip galvanic metals. Embodiment selection is accordingly determined by cost, power, size, complexity, longevity, toxicity, and over all performance desires.

FIG. 5e depicts an example block diagram circuit architecture comprising a plurality of stacked galvanic powered micro-chips. In one embodiment, the top metal plate (such as copper) near the top surface of the micro-chip (37) is interconnected down below using vias (39) and leading to a plurality of capacitors (C6 and C7) and integrated circuits below. This node may be the positive electrode of the galvanic cell (Vp). The negative electrode may be routed to circuits below using vias (38) and leading to a plurality of capacitors and integrated circuits. This negative electrode node may ultimately be connected to a metal such as zinc or tungsten or aluminum which is more negative than copper and may be external to the micro-chip stack. A positive electrode metal (such as copper) may also be external to the micro-chip stack. The negative electrode metals may also reside affixed and exposed on the top of the micro-chip stack. As such, a small DC voltage may be locally supplied to some or all of the micro-chip stack circuits using galvanic metals on or substantially near the micro-chips. In much the same way that any of the preceding embodiments were formed, fabricated, placed, structured, or utilized, a stacked micro-chip assembly may also be placed in water moistened soil, sea water, or other effective electrolyte solutions, and surrounded in whole or in part by sheeting or masses of various metal electrodes. A containment vessel or housing for a galvanic powered micro-chip or micro-chip stack may have a plurality of the features described in the preceding figures and descriptions. Further, galvanic powered micro-chips may also be placed inside of any of the embodiments previously described. A plurality of galvanic cell embodiments and implementations may be utilized together, in parallel or series. The metal surface area for a negative electrode is preferably 1 to 10 times the surface area of the positive electrode, but the surface area of either can be substantially more or substantially less. The metals shall be selected in order to achieve product goals, including simplicity, performance, toxicity, longevity, reliability, and cost. In an alternate embodiment, a tungsten or aluminum or zinc or copper mass may also reside exposed or affixed to any surface of the micro-chip stack. Galvanic cells may be formed from numerous different metals as long as a voltage difference exists between them. The relatively small DC voltage difference between the metal electrodes can then be up-converted or down-converted, and regulated for usage with the micro-chip stack. Capacitors C6 and C7 denote a plurality of electrical storage elements either within the micro-chip stack structure or external to the micro-chip stack. C6 and C7 store electrical charge from the galvanic reaction and feed up-conversion, down-conversion, or regulation circuits depicted by circuit block U2. These storage and conversion circuits may be designed into the micro-chip stack on any chip in the stack-up, and accordingly be connected to a plurality of other circuits in the micro-chip stack depicted by U3 and UN. Signals and electricity may be passed between the micro-chip stack layers and between circuit blocks. Electrical signal connections and communications may be passed within each chip or throughout the chip stack using means such as bond wire connectivity, via connectivity, form-able metals such as lead or similar, capacitor coupling, radio frequency transmission, light emission, magnetic coupling, or RF coupling. The voltage and current required to power circuits in a micro-chip stack may vary with semiconductor fabrication processes and circuit architectures. The galvanic cells are sized accordingly for desired circuit requirements and operations. Up-conversion (DC to AC, or DC to DC conversion), down-conversion (DC to AC, or DC to DC conversion), and voltage regulation circuits are leveraged to take the galvanic cell energy or electrical energy stored in a plurality of capacitors such as C6 and C7 and create the voltage and current levels necessary to power the plurality of micro-chip circuits in the stack-up.

In an alternate embodiment, FIGS. 5a, 5b, 5c, 5d, and 5e, may make take the form of a water, electrolyte, soil, or moisture sensor. The sensor may be placed near water or electrolyte sources, such as in buildings, near washing machines, sinks, pipes, chemical processes, etc. A water, electrolyte, soil, or moisture sensor may also be placed in boats, homes, basements, or water traveling vessels. When intended substances find their way to the micro-chip sensor, the galvanic reaction may power-up the micro-chip or the micro-chip stack and initiate operations such as sending notification of a sensed problem or reaction via optical, electrical, or RF signaling means. This implementation may negate the need to have conventional sensors or conventional battery cells or power feeds to power micro-chip sensors. Communications or notifications from the micro-chips may be made by visual light, invisible light, audio, ultra-sonic frequency, radio frequency, or digitally communicated or coded means such as a cellular communication, an email notification, text message notification, digital bus communication or flag, or an app notification by way of a phone, computing device, or smart phone, or tablet device. Some exemplary circuits for implementing these features have been generally detailed in the numerous earlier embodiments and figures. One skilled in the art will appreciate the spirit of the invention and the many ways and methods in which these galvanic systems and devices may be formed, connected, fabricated, located, used, and combined.

In yet another embodiment, capacitor C6 may be substantially large in capacity versus the electrical charge generated by the relatively small metallic surface areas of the galvanic cell. C6 may be a super-capacitor with a plurality of Farads in capacity. In this case, capacitor C6 may take many minutes, hours, or days to charge-up substantially. After C6 has charged sufficiently, a substantial amount of the stored electrical energy may be directed or provided to a micro-chip or micro-chip stack in a quick burst, or momentary usage. C6 may therein be used for short burst of radio frequency or optical communications from the micro-chip stack assembly. Or the stored electricity in C6 may be used to burst a substantial amount of power into lights or sound emitting devices for data communications or visual notifications. These visual and data notification means may include fiber optics, lasers, light emitting diodes, gaseous bulbs, and the associated driver circuits may reside in the micro-chip design or micro chip stack. In this fashion, the relatively low DC output from a galvanic cell may be overcome by storing substantial charge in capacitors before activating or powering up micro-circuits on the micro-chip or stack.

In yet another embodiment, the DC voltage generated by the galvanic cell may be too high for the micro-chip transistors or circuits. This may occur with modern semiconductor or carbon nano-tube processes requiring very low DC voltages for operation. In this case, the micro-chip or micro-chip stack may possess down-conversion circuits such as DC to DC conversion, wherein the DC voltage of the galvanic cell is reduced and regulated to supply the appropriate lower DC voltage levels required by the transistors and circuits within the micro-chip or stack.

A plurality of micro-chips may be stacked on top of one another in order to achieve a compact galvanic powered system of micro-chips. The interconnect between the micro-chips may be made using vias, form-able metals such as lead, inherent proximity, or by using bond wires stepping between the plurality chips. In another embodiment, vias, form-able metals, and bond wires may all be used for the interconnects between the chips in the stack. Signals and electricity may also be coupled capacitively, inductively, magnetically, optically, or resistively between the chips.

FIG. 5*f* depicts an embodiment wherein 1 or more micro-chips are stacked on top of a metallic sheet (50) residing affixed to one end of a micro-chip or micro-chip stack. In preferred embodiment, the metallic sheet (50) is comprised substantially of zinc or aluminum or tungsten and resides on one end of the stack. The metallic sheet (50) may be epoxied, glued, or eutectic die attached (51) to the substrate material or epi-layer (47) wherein the negative electrode (such as zinc) provides Vn electrical potential to the chip stack through the epi-layer or substrate. In an alternate embodiment the metallic sheet (50) may be affixed (51) to the epi-layer or substrate (47) with a form-able metal such as lead or similar. The form-able metal interconnect may be substantially electrically conductive, or substantially non-conductive. In any of these embodiments, the metallic sheet (50) may be electrically connected to a bond pad via an interconnect wire so as to provide Vn to the chip-stack through a bond pad interconnect. In yet another embodiment, the metallic sheet (50) may serve as the positive electrode (copper) and be connected to the chip stack accordingly. In this embodiment, the exposed surface metal (37) may alternatively comprise the negative electrode (Vn) and be fabricated from a metal such as aluminum or tungsten or zinc. The embodiment depicted in FIG. 5*f* may have utility in reducing cost and improving the manufacturability of the galvanic powered chip stack. The chip stack may comprise 1 micro-chip or a plurality of micro-chips. The chips may be stacked in same physical orientation (face to back), or in opposing orientations (back to back, or face to face), or a mixture of both (back to back, or front to back). Reference numeral 49 generally depicts where an electrically insulating encapsulant may be formed or deposited over the micro-chip assembly excluding the exterior surface of the upper plate (37) and the lower metallic sheet (50) which are substantially exposed for galvanic reactions. In this embodiment, the micro-chip assembly is substantially protected and electrically isolated. The encapsulant such as epoxy or glue may also cover the bond pads, electrically isolating them from galvanic processes and protecting them. Interconnects denoted by reference numeral 36 may also be encapsulated or coated with teflon or epoxy or plastics or glass so as to inhibit any reactions of the metallic wires with the galvanic cell chemistry. In cases where these interconnect wires would contact the galvanic cell chemistry, they are preferably insulated but in some embodiments the affects may be negligible and protective coatings may not be necessary, still yielding acceptable circuit operations and life expectancy for the systems and devices (e.g. flood monitor, emergency sensor, etc.). For example, in applications where the galvanic assembly is only briefly exposed to electrolyte solutions once in its useful life.

FIG. 5*g* presents an electrical interconnect block diagram for a stacked embodiment of FIG. 5*f* where metallic sheets (37 and 50) are utilized to substantially power a micro-chip or micro-chips, in whole or in part. In one embodiment, the metallic sheet 50 may be zinc or tungsten or aluminum and serve as Vn. Metallic sheet 37 may be copper or similar and serve as Vp. In an alternate embodiment, the galvanic metals may be swapped and metallic sheet 37 may be comprised of aluminum or tungsten or zinc and serve as Vn, and metallic sheet 50 may be comprised of copper or similar and serve as Vp. The metal sheets may be placed in a plurality of useful orientations and locations as described in previous embodiments.

CONCLUSION, RAMIFICATIONS, AND SCOPE

The disclosed embodiments are illustrative, not restrictive. While numerous embodiments of the invention have been described, it is understood that the invention can be appreciated in a variety of environmental circumstances, means, combinations, systems, devices, and methods. Although the present invention has been described in considerable detail with reference to certain versions thereof, other versions and combinations are possible. Therefore, the spirit and scope of the invention and claims should not be limited to the description of the preferred versions contained therein.

All features disclosed in this specification (including any accompanying claims, abstract, and drawings) may be replaced by alternative features serving the same, equivalent or similar purpose, unless expressly stated otherwise. Each feature disclosed is only one example of a generic series of equivalent or similar features or embodiments.

I claim:

1. A galvanic battery cell system comprising:
    a galvanic cell containment apparatus,
    said containment apparatus possessing shape selected from the group consisting of substantially cylindrical, substantially discoidal, and substantially conical,
    a first electrode possessing substantial outline of at least one of the inside surfaces of said containment apparatus,
    a second electrode comprising a substantially spiraled electrical conductor possessing shape selected from the group consisting of substantially conical, substantially discoidal, and substantially helical,
    the entirety of said first electrode residing exterior to the volumetric outline of said second electrode, said containment apparatus possessing lower drainage control and access features selected from the group consisting of removable bottom containment reservoir means, containment reservoir means, removable bottom containment reservoir and plug means, plug means, removable plug means, at least one removable drain plug, at least one drain hole, and a plurality of drain holes.

2. The galvanic battery cell system according to claim 1 further comprising:
at least one electrical manipulation circuit capable of being positioned either substantially within said containment apparatus or located within an operable distance from said containment apparatus,
said electrical manipulation circuit possessing utility to transform electricity generated by said galvanic battery cell system and produce at least one output selected from the group consisting of substantially periodic voltage spikes, substantially periodic current spikes, substantially periodic electrical oscillations, electrical wave-forms, communication signals, signal transmissions, coded transmissions, sounds, ultra-sounds, light, rays, radio waves, and substantially periodic electrical wave-forms for driving the antenna input node of a suitable antenna electricity harvesting system.

3. The galvanic battery cell system according to claim 1 further comprising:
at least one circuit or system selected from the group consisting of galvanic powered integrated circuit systems, antenna electricity harvesting systems, circuit schematic means generally defined in FIGS. 3a, 3b, 3c, 3d, 3e, 3f, 3g, 3h, 3i, 4a, 4b, 4c, 4d, 4e, 4f, 4g, and effective combinations of means and systems thereof.

4. The galvanic battery cell system according to claim 1 further comprising:
said first electrode positioned substantially adjacent or substantially near a location selected from the group consisting of inner base surfaces of said containment apparatus, inner wall surfaces of said containment apparatus, at least one inside surface region of said containment apparatus, at least one inner surface of said containment apparatus, and substantially surrounding said second electrode.

5. The galvanic battery cell system according to claim 1 further comprising:
a separable base,
at least one handle or at least one designated region for grabbing, lifting, or moving said system.

6. The galvanic battery cell system according to claim 1 further comprising:
said first electrode comprising a substantially flat electrically conductive sheet,
said electrically conductive sheet capable of being cut, shaped, folded, or reformed producing substantial shape of at least one inner region of said containment apparatus, or shapes substantially enclosing or surrounding said second electrode.

7. The galvanic battery cell system according to claim 1 further comprising:
said containment apparatus possessing at least partial optical or radio frequency transparency.

8. The galvanic battery cell system according to claim 1 further comprising:
a region or space at least partially occupying the inner bounds of said second electrode,
said region or space possessing a shape selected from the group consisting of substantially cylindrical, substantially conical, substantially discoidal, and substantially conforming to the inner bounds of said second electrode,
said region or space capable of substantially accommodating contents selected from the group consisting of at least one electrical conversion circuit at least one electrical load circuit, a suitable galvanic powered integrated circuit system, a suitable antenna electricity harvesting system, wholly voided of physical contents, at least partially filled with electrolyte, at least partially filled with soil, at least partially filled with sand, and at least partially filled with water.

9. A galvanic battery cell system comprising:
a galvanic cell containment apparatus,
said containment apparatus possessing shape selected from the group consisting of substantially cylindrical, substantially discoidal, and substantially conical,
a first electrode possessing substantial outline of at least one of the inside surfaces of said containment apparatus,
a second electrode substantially fitting within the confines of said first electrode,
said second electrode comprising a substantially spiraled electrical conductor possessing shape selected from the group consisting of substantially conical, substantially discoidal, and substantially helical,
said containment apparatus possessing lower drainage control and access features selected from the group consisting of removable bottom containment reservoir means, containment reservoir means, removable bottom containment reservoir and plug means, plug means, removable plug means, at least one removable drain plug, at least one drain hole, and a plurality of drain holes,
a separable base,
at least one handle or at least one designated region for grabbing, lifting, or moving said system.

10. The galvanic battery cell system according to claim 9 further comprising:
at least one electrical manipulation circuit capable of being positioned either substantially within said containment apparatus or located within an operable distance from said containment apparatus,
said electrical manipulation circuit possessing utility to transform electricity generated by said galvanic battery cell system and produce at least one output selected from the group consisting of substantially periodic voltage spikes, substantially periodic current spikes, substantially periodic electrical oscillations, electrical wave-forms, communication signals, signal transmissions, coded transmissions, sounds, ultra-sounds, light, rays, radio waves, and substantially periodic electrical wave-forms for driving the antenna input node of a suitable antenna electricity harvesting system.

11. The galvanic battery cell system according to claim 9 further comprising:
at least one circuit or system selected from the group consisting of galvanic powered integrated circuit systems, antenna electricity harvesting systems, circuit schematic means generally defined in FIGS. 3a, 3b, 3c, 3d, 3e, 3f, 3g, 3h, 3i, 4a, 4b, 4c, 4d, 4e, 4f, 4g, and effective combinations of means and systems thereof.

12. The galvanic battery cell system according to claim 9, further comprising:
said first electrode positioned substantially adjacent or substantially near a location selected from the group consisting of inner base surfaces of said containment apparatus, inner wall surfaces of said containment apparatus, at least one inside surface region of said containment apparatus, at least one inner surface of said containment apparatus, and substantially surrounding said second electrode.

13. The galvanic battery cell system according to claim 9 further comprising:
said first electrode comprising a substantially flat electrically conductive sheet,
said electrically conductive sheet capable of being cut, shaped, folded, or reformed producing substantial shape of at least one inner region of said containment apparatus, or shapes substantially enclosing or surrounding said second electrode.

14. The galvanic battery cell system according to claim 9 further comprising:
said containment apparatus possessing at least partial optical or radio frequency transparency.

15. The galvanic battery cell system according to claim 9 further comprising:
a region or space at least partially occupying the inner bounds of said second electrode,
said region or space possessing a shape selected from the group consisting of substantially cylindrical, substantially conical, substantially discoidal, and substantially conforming to the inner bounds of said second electrode,
said region or space capable of substantially accommodating contents selected from the group consisting of at least one electrical conversion circuit at least one electrical load circuit, a suitable galvanic powered integrated circuit system, a suitable antenna electricity harvesting system, wholly voided of physical contents, at least partially filled with electrolyte, at least partially filled with soil, at least partially filled with sand, and at least partially filled with water.

16. A galvanic battery cell system comprising:
a galvanic cell containment apparatus,
said containment apparatus possessing shape selected from the group consisting of substantially cylindrical, substantially discoidal, and substantially conical,
a first electrode comprised of a form-able sheet,
a second electrode capable of substantially fitting within the confines of said first electrode,
said second electrode form-able into a substantially spiraled electrical conductor possessing shape selected from the group consisting of substantially conical, substantially discoidal, and substantially helical,
said containment apparatus possessing lower drainage control and access features selected from the group consisting of removable bottom containment reservoir means, containment reservoir means, removable bottom containment reservoir and plug means, plug means, removable plug means, at least one removable drain plug, at least one drain hole, and a plurality of drain holes,
a separable base,
at least one handle or at least one designated region for grabbing, lifting, or moving said system.

17. The galvanic battery cell system according to claim 16 further comprising:
at least one electrical manipulation circuit capable of being positioned either substantially within said containment apparatus or located within an operable distance from said containment apparatus,
said electrical manipulation circuit possessing utility to transform electricity generated by said galvanic battery cell system and produce at least one output selected from the group consisting of substantially periodic voltage spikes, substantially periodic current spikes, substantially periodic electrical oscillations, electrical wave-forms, communication signals, signal transmissions, coded transmissions, sounds, ultra-sounds, light, rays, radio waves, and substantially periodic electrical wave-forms for driving the antenna input node of a suitable antenna electricity harvesting system.

18. The galvanic battery cell system according to claim 16 further comprising:
at least one circuit or system selected from the group consisting of galvanic powered integrated circuit systems, antenna electricity harvesting systems, circuit schematic means generally defined in FIGS. 3a, 3b, 3c, 3d, 3e, 3f, 3g, 3h, 3i, 4a, 4b, 4c, 4d, 4e, 4f, 4g, and effective combinations of means and systems thereof.

19. The galvanic battery cell system according to claim 16 further comprising:
said first electrode positioned substantially adjacent or substantially near a location selected from the group consisting of inner base surfaces of said containment apparatus, inner wall surfaces of said containment apparatus, at least one inside surface region of said containment apparatus, at least one inner surface of said containment apparatus, and substantially surrounding said second electrode.

20. The galvanic battery cell system according to claim 16 further comprising:
a region or space at least partially occupying the inner bounds of said second electrode,
said region or space possessing a shape selected from the group consisting of substantially cylindrical, substantially conical, substantially discoidal, and substantially conforming to the inner bounds of said second electrode,
said region or space capable of substantially accommodating contents selected from the group consisting of at least one electrical conversion circuit at least one electrical load circuit, a suitable galvanic powered integrated circuit system, a suitable antenna electricity harvesting system, wholly voided of physical contents, at least partially filled with electrolyte, at least partially filled with soil, at least partially filled with sand, and at least partially filled with water.

* * * * *